US012189265B2

(12) United States Patent
Miyazaki et al.

(10) Patent No.: US 12,189,265 B2
(45) Date of Patent: Jan. 7, 2025

(54) OPTICAL MODULATOR AND OPTICAL TRANSMISSION DEVICE USING SAME

(71) Applicant: SUMITOMO OSAKA CEMENT CO., LTD., Tokyo (JP)

(72) Inventors: Norikazu Miyazaki, Tokyo (JP); Toru Sugamata, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 342 days.

(21) Appl. No.: 17/605,690

(22) PCT Filed: Apr. 23, 2020

(86) PCT No.: PCT/JP2020/017525
§ 371 (c)(1),
(2) Date: Oct. 22, 2021

(87) PCT Pub. No.: WO2020/218434
PCT Pub. Date: Oct. 29, 2020

(65) Prior Publication Data
US 2022/0146902 A1 May 12, 2022

(30) Foreign Application Priority Data
Apr. 25, 2019 (JP) .................. 2019-083847

(51) Int. Cl.
*G02F 1/225* (2006.01)
*G02F 1/01* (2006.01)
(Continued)

(52) U.S. Cl.
CPC .......... *G02F 1/2255* (2013.01); *G02F 1/0121* (2013.01); *G02F 1/035* (2013.01);
(Continued)

(58) Field of Classification Search
CPC ........ G02F 1/2255; G02F 1/212; G02F 1/035; G02F 1/0316; G02F 1/0121;
(Continued)

(56) References Cited

U.S. PATENT DOCUMENTS 9,507,235 B2 * 11/2016 Sugiyama ............. G02F 1/2255
9,523,872 B2 * 12/2016 Kataoka ................ G02F 1/0356
(Continued)

FOREIGN PATENT DOCUMENTS

JP  2016-109941   6/2016
JP  2018-106091   7/2018

OTHER PUBLICATIONS

International Search Report, Date of mailing: Aug. 4, 2020, 3 pages.

*Primary Examiner* — Michelle R Connelly
(74) *Attorney, Agent, or Firm* — Rankin, Hill & Clark LLP

(57) ABSTRACT

An optical modulator includes an optical modulation element having a plurality of signal electrodes, a plurality of signal input terminals, a relay substrate on which a plurality of signal conductor patterns that electrically connect the signal input terminals and the signal electrodes and a plurality of ground conductor patterns are formed, and a housing. A signal input side and signal output side of the relay substrate face each other in a plan view, and electromagnetic wave propagation suppressing units that are made of a material that absorbs electromagnetic waves and have a height protruding from a surface of the relay substrate are provided, along at least one side of an end portion of the signal input side and an end portion of the signal output side in the plan view.

9 Claims, 19 Drawing Sheets

(51) Int. Cl.
*G02F 1/035* (2006.01)
*G02F 1/21* (2006.01)
*H05K 1/02* (2006.01)

(52) U.S. Cl.
CPC ............ *G02F 1/0356* (2013.01); *G02F 1/212* (2021.01); *H05K 1/02* (2013.01)

(58) Field of Classification Search
CPC ...... G02F 1/0327; G02F 1/225; G02F 1/0356; G02F 1/025; G02F 1/0305; G02F 2201/12
See application file for complete search history.

(56) References Cited

U.S. PATENT DOCUMENTS

| | | | | |
|---|---|---|---|---|
| 9,571,203 | B2* | 2/2017 | Sugiyama | G02F 1/2255 |
| 9,588,359 | B2* | 3/2017 | Sugiyama | G02B 6/4246 |
| 9,778,539 | B2* | 10/2017 | Miyazaki | G02F 1/2255 |
| 10,088,698 | B1* | 10/2018 | Ishikawa | G02F 1/0327 |
| 10,120,209 | B2* | 11/2018 | Sugiyama | H05K 1/189 |
| 10,268,057 | B2* | 4/2019 | Katou | G02F 1/225 |
| 2016/0161771 | A1* | 6/2016 | Sugiyama | G02F 1/0316 385/3 |
| 2016/0291351 | A1* | 10/2016 | Kataoka | G02F 1/0356 |
| 2017/0212402 | A1* | 7/2017 | Ishii | H01R 24/38 |

* cited by examiner

DETAILED VIEW OF PART A

OPTICAL MODULATOR AND OPTICAL TRANSMISSION DEVICE USING SAME

TECHNICAL FIELD

The present invention relates to an optical modulator including a relay substrate that relays propagation of an electrical signal between a signal input terminal and an optical modulation element electrode, and an optical transmission apparatus using the optical modulator.

BACKGROUND ART

In a high-speed/large-capacity optical fiber communication system, an optical modulator incorporating a waveguide type optical modulation element is often used. Among them, an optical modulation element using $LiNbO_3$ (hereinafter, also referred to as LN) having an electro-optic effect for a substrate can realize high-bandwidth optical modulation characteristics with a small light loss, so the optical modulation element is widely used in high-speed/large-capacity optical fiber communication systems.

The optical modulation element using the LN substrate includes Mach-Zehnder type optical waveguides and signal electrodes for applying a high-frequency electrical signal as a modulation signal to the optical waveguides. Then, the signal electrodes provided in the optical modulation element are connected to lead pins and connectors that are signal input terminals provided on a housing, via a relay substrate provided in the housing of the optical modulator that accommodates the optical modulation element. Thus, since the lead pins and connectors that are signal input terminals are connected to a circuit substrate on which an electronic circuit for causing the optical modulator to perform a modulation operation is mounted, an electrical signal output from the electronic circuit is applied to the signal electrodes of the optical modulation element via the relay substrate.

Due to the increasing transmission capacity in recent years, the main stream of modulation methods in optical fiber communication systems is multi-level modulation and the transmission format adopting polarized wave multiplexing for multi-level modulation, such as Quadrature Phase Shift Keying (QPSK) and Dual Polarization-Quadrature Phase Shift Keying (DP-QPSK), which are used in fundamental optical transmission networks and is also being introduced into metro networks.

An optical modulator that performs QPSK modulation (QPSK optical modulator) and an optical modulator that performs DP-QPSK modulation (DP-QPSK optical modulator) include a plurality of Mach-Zehnder optical waveguides having a so-called nested structure called a nested type, each of which has at least one signal electrode. Therefore, the optical modulators are provided with a plurality of signal electrodes, and the above-described DP-QPSK modulation operation is performed in cooperation with high-frequency electrical signals applied to the signal electrodes.

FIG. 22 is a plan view illustrating an example of a configuration of an optical modulator including such a relay substrate in the related art. An optical modulator 2200 includes, for example, an optical modulation element 2202 which is a DP-QPSK modulator formed on an LN substrate, and a housing 2204 that accommodates the optical modulation element 2202. Here, the housing 2204 is configured with a case 2214a and a cover 2214b. The optical modulator 2200 also includes an input optical fiber 2208 and an output optical fiber 2210 which are fixed to the case 2214a and perform an input and output of light to the optical modulation element 2202.

Four signal input terminals 2224a, 2224b, 2224c, and 2224d (hereinafter, collectively also referred to as a signal input terminal 2224) for inputting a high-frequency electrical signal for driving the optical modulation element 2202 from an external electronic circuit are further provided, in the case 2214a of the housing 2204. Specifically, the signal input terminal 2224 is, for example, a center electrode of electrical connectors 2216a, 2216b, 2216c, and 2216d (hereinafter, collectively also referred to as an electrical connector 2216) which are high-frequency coaxial connectors. The high-frequency electrical signals input from the respective signal input terminals 2224 are input to one ends of the four signal electrodes 2212a, 2212b, 2212c, and 2212d (hereinafter, collectively also referred to as a signal electrode 2212) provided in the optical modulation element 2202 via a relay substrate 2218 accommodated in the housing 2204, and terminated by a terminator 2220 with a predetermined impedance provided at the other end of the signal electrode 2212.

In such an optical modulator 2200 in which high-frequency electrical signals respectively given to a plurality of signal electrodes 2212 cooperate to perform DP-QPSK modulation, for example, all the high-frequency electrical signals need to be input to the signal electrode 2212 of the optical modulation element 2202 without being affected by noise or the like. However, on the other hand, the demand for miniaturization of the optical modulator 2200 remains unchanged, and the relay substrate 2218 is being miniaturized along with the miniaturization of the housing 2204 of the optical modulator 2200. As a result, a plurality of different high-frequency signals propagated in close proximity to each other in the narrow relay substrate 2218, and electrical crosstalk between the high-frequency signal lines formed on the relay substrate 2218 cannot be ignored.

In addition, commercial DP-QPSK modulators are often used at a transmission rate of 100 Gb/s at present, and development to expand this transmission rate to 400 Gb/s is also in progress. If the transmission rate is increased in the future, a problem of crosstalk between the high-frequency signal lines that occurs in the relay substrate can become a more serious problem.

As a method of suppressing the crosstalk, it is conceivable to increase a distance between adjacent high-frequency signal lines, but this method violates the above-described demand for miniaturization of the optical modulator, and it is difficult to adopt the method. Therefore, for example, by providing vias on ground electrodes provided between the high-frequency signal lines and connecting the vias to a ground layer on a back surface of the relay substrate, the ground electrodes are strengthened to improve a shielding effect between the high-frequency signal lines.

However, in a DP-QPSK modulator having a high transmission rate of 400 Gb/s or higher, crosstalk may not be sufficiently suppressed by the above-described vias alone.

The inventor of the present invention has made extensive studies on the factors of the crosstalk, and founds that at a high transmission rate of 400 Gb/s or higher as described above, the influence of new leaked microwaves becomes apparent on the operation at the transmission rate of 100 Gb/s in the related art.

That is, in the high transmission rate as described above, in addition to the influence of direct transfer of high-frequency signal energy between the proximity lines or the direct influence of leaked microwaves diverging from a connection point between a signal input terminal to which the high-frequency signals are input and a conductor pattern of the relay substrate and its vicinity into a space, the influence of crosstalk deterioration of high-frequency signals due to relatively strong leaked microwaves that are generated and/or propagated directionally toward a side surface direction of the relay substrate also can occur.

FIG. 23 is an explanatory diagram for explaining a generation and propagation of such leaked microwaves toward a side surface direction of a relay substrate. Here, FIG. 23 illustrates the relay substrate 2218 and its periphery in the optical modulator 2200 illustrated in FIG. 22. On the relay substrate 2218, the signal conductor pattern 2230a, 2230b, 2230c, and 2230d (hereinafter, collectively also referred to as a signal conductor pattern 2230) respectively connecting the four signal input terminals 2224 and the four signal electrodes 2212 of the optical modulation element 2202 are formed. These signal conductor patterns 2230 form a high-frequency signal line together with ground conductor patterns 2240a, 2240b, 2240c, 2240d, and 2240e arranged on the relay substrate 2218 so as to sandwich the signal conductor pattern 2230 in a substrate surface direction.

In the relay substrate 2218 illustrated in FIG. 23, the high-frequency signal line configured with the signal conductor pattern 2230 and the ground conductor pattern 2240 is generally a coplanar waveguide, and a propagation mode of the high-frequency signal propagating through the line is a coplanar mode (hereinafter, referred to as "CPW mode"). On the other hand, the signal input terminal 2224 is generally configured with, for example, a coaxial connector, a lead pin, or the like as described above, and the propagation mode of a high-frequency signal until an input to the relay substrate 2218 is a coaxial mode.

Therefore, at four connection points (hereinafter, signal connection points) at which the four signal input terminals 2224 and the four signal conductor pattern 2230 of the relay substrate 2218 are respectively connected, the propagation mode is converted from the coaxial mode to the CPW mode (that is, heterogeneous mode conversion). As a result, a part of energy of the high-frequency signal propagated in the coaxial mode is converted into a radiation mode at each of the signal connection points, and can be emitted into the air as leaked microwaves.

That is, each of the signal connection points functions as a point wave source of the leaked microwave, and as an approximate simple model, the leaked microwave becomes a spherical wave 2290, and is emitted into a space from each of the signal connection points. The spherical waves 2290 emitted from the respective signal connection points interfere with each other, and a diffracted wave 2292 having high directivity and propagating on a surface of the relay substrate 2218 is generated in a direction of left and right side surfaces of the relay substrate 2218.

Intensities of the leaked microwave as the diffracted wave 2292 toward the side surface direction (hereinafter, also referred to as lateral leaked microwave) become higher in a case where wavelengths and phases of the high-frequency signals (signal microwave) input to the signal connection points are approximately equal and the signal connection points are close to each other, and can affect the operation of the optical modulation element 2202.

For example, in the DP-QPSK optical modulator, two high-frequency electrical signals having substantially the same wavelength in phase are respectively input to two nested type Mach-Zehnder optical waveguides constituting the optical modulator. Therefore, for example, in a DP-QPSK optical modulator for 400 Gb/s, which is being miniaturized and widened in bandwidth, a plurality of signal microwaves having substantially the same wavelength and phase are input to adjacent signal connection points. Therefore, adverse effects on the operation of the optical modulation element 2202, such as deterioration of crosstalk between the signal electrodes 2212 due to the lateral leaked microwave described above, may become apparent.

The existence of relatively strong lateral leaked microwaves generated and/or propagated toward the side surface direction of the relay substrate 2218 is a phenomenon that is not yet recognized by those skilled in the art, and no special measures are taken in the technology in the related art.

For example, in the related art, in order to suppress high-frequency reflection, radiation, and/or leakage at the relay substrate as described above, the impedance at a connection portion between the conductor pattern of the relay substrate and the lead pin is matched with higher accuracy to the impedance of a high-frequency transmission channel formed by each of the conductor pattern and lead pin (for example, see Patent Literature No. 1).

However, the technology in the related art is effective at a transmission rate of 100 Gb/s, but does not provide an effective solution to the problem of an optical modulation element operation such as crosstalk deterioration due to the above-described lateral leaked microwave at a transmission rate of 400 Gb/s or higher.

CITATION LIST

Patent Literature

[Patent Literature No. 1] Japanese Laid-open Patent Publication No. 2018-106091

SUMMARY OF INVENTION

Technical Problem

From the above background, in an optical modulator including a relay substrate that electrically connects each of signal electrodes of an optical modulation element and each of signal input terminals, it is required to effectively suppress the influence of leaked microwaves that may be generated from a signal connection point between the relay substrate and the signal input terminal, and to realize appropriate optical modulation characteristics.

Solution to Problem

According to one aspect of the present invention, there is provided an optical modulator including: an optical modulation element that includes a plurality of signal electrodes; a plurality of signal input terminals each of which inputs an electrical signal to be applied to each of the signal electrodes; a relay substrate on which a plurality of signal conductor patterns that electrically connect the signal input terminals to the signal electrodes, and a plurality of ground conductor patterns are formed; a housing that accommodates the optical modulation element and the relay substrate, in which among sides of the relay substrate, a signal input side on which the signal input terminal is connected to the signal conductor pattern and a signal output side on which the signal conductor pattern is connected to the signal electrode face each other in a plan view, and an electromagnetic wave propagation suppressing unit made of a material that absorbs electromagnetic waves and having a height protruding from a surface of the relay substrate is provided along at least one side connecting an end portion of the signal input side and an end portion of the signal output side in the plan view, among the sides of the relay substrate.

According to another aspect of the present invention, the relay substrate is mounted at a substrate carrier provided separately from the housing, and the electromagnetic wave propagation suppressing unit is provided at the substrate carrier.

According to still another aspect of the present invention, the electromagnetic wave propagation suppressing unit is made of metal, and the electromagnetic wave propagation suppressing unit and the ground conductor pattern of the relay substrate are connected by a metal wire or a metal ribbon.

According to still another aspect of the present invention, the electromagnetic wave propagation suppressing unit is provided on the relay substrate.

According to still another aspect of the present invention, a length of the electromagnetic wave propagation suppressing unit along a side of the relay substrate on which the electromagnetic wave propagation suppressing unit is formed is equal to or higher than ⅕ of a length of the side.

According to still another aspect of the present invention, a recess portion or a protruding portion is formed on a surface of the electromagnetic wave propagation suppressing unit.

According to still another aspect of the present invention, the electromagnetic wave propagation suppressing unit includes a plurality of metal wires or metal ribbons connected to the ground conductor pattern of the relay substrate.

According to still another aspect of the present invention, the height of the electromagnetic wave propagation suppressing unit measured from the surface of the relay substrate is larger than a separation distance between the signal conductor pattern formed on the relay substrate and the ground conductor pattern adjacent to the signal conductor pattern electrode.

According to still another aspect of the present invention, there is provided an optical transmission apparatus including any one of the optical modulators described above and an electronic circuit that outputs an electrical signal for causing the optical modulator to perform a modulation operation.

This application claims the benefit of Japanese Patent Application No. 2019-083847 filed on Apr. 25, 2019, the disclosure of which is herein incorporated by reference in its entirety.

Advantageous Effects of Invention

According to the present invention, in an optical modulator including a relay substrate, an influence of leaked microwaves that may be generated from a signal connection point between the relay substrate and a signal input terminal can be effectively suppressed to realize appropriate optical modulation characteristics.

DESCRIPTION OF EMBODIMENTS

In order to solve the above problems, embodiments and its modification examples which will be described below provide an optical modulator with an optical modulation element and a relay substrate, including an electromagnetic wave propagation suppressing unit configured with a material that absorbs electromagnetic waves, and having a height protruding above a surface of the relay substrate, along at least one side except for a side on which a signal conductor pattern formed on the relay substrate is connected to a signal electrode of the optical modulation element, among sides of the relay substrate.

Hereinafter, embodiments of the present invention will be described with reference to the drawings.

First Embodiment

First, a first embodiment of the present invention will be described. In an optical modulator according to the present embodiment, a relay substrate is mounted on a substrate carrier configured separately from a housing of the optical modulator and accommodated in the housing, and the electromagnetic wave propagation suppressing unit is formed at the substrate carrier.

Figure 1:
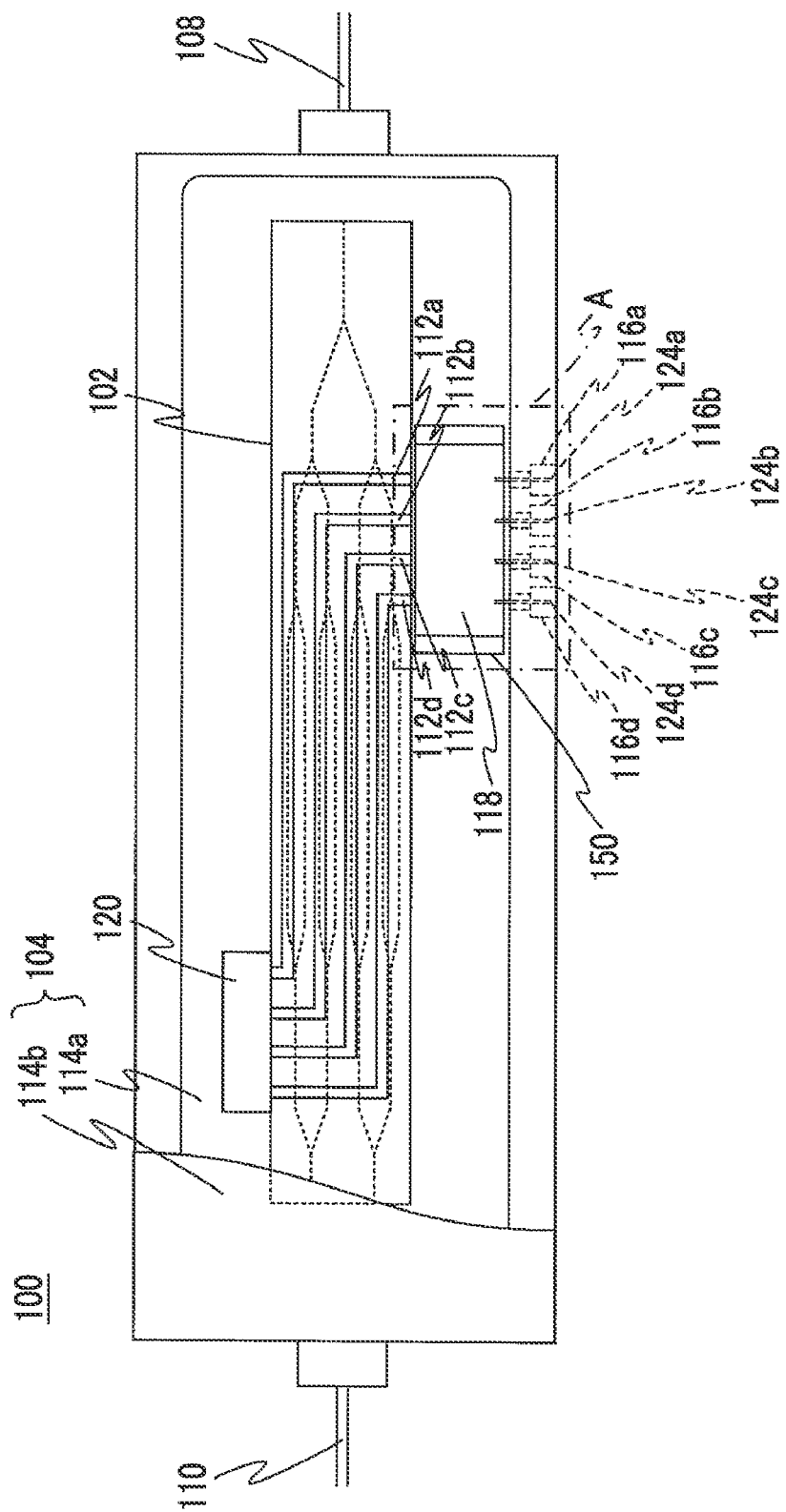
FIG. 1 is a plan view of an optical modulator according to a first embodiment of the present invention.
Figure 2:
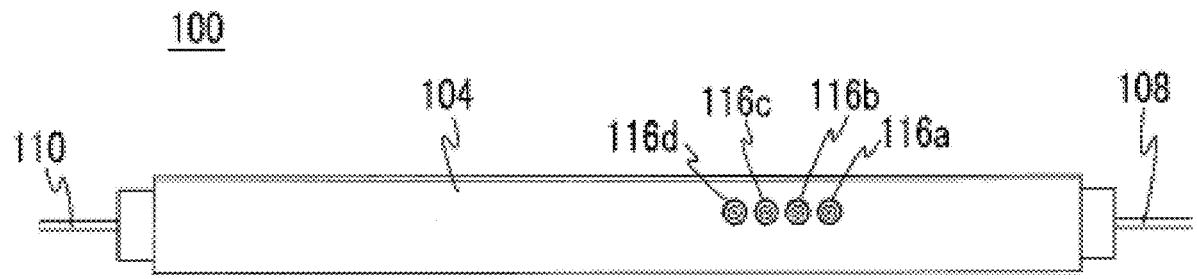
FIG. 2 is aside view of the optical modulator illustrated in FIG. 1.

FIGS. 1 and 2 are diagrams illustrating a configuration of an optical modulator 100 according to the first embodiment of the present invention. Here, FIGS. 1 and 2 are a plan view and a side view of the optical modulator 100, respectively.

The optical modulator 100 includes an optical modulation element 102, a housing 104 that accommodates the optical modulation element 102, an input optical fiber 108 for inputting light into the optical modulation element 102, and an output optical fiber 110 that guides the light output from the optical modulation element 102 to an outside of the housing 104.

The optical modulation element 102 is, for example, a DP-QPSK modulator that performs optical modulation of 400 Gb/s, and includes, for example, four Mach-Zehnder type optical waveguides provided on an LN substrate. The four Mach-Zehnder type optical waveguides are provided with four signal electrodes 112a, 112b, 112c, and 112d (hereinafter, collectively also referred to as a signal electrode 112) that respectively modulate light waves propagating through the Mach-Zehnder type optical waveguide. In addition, as known in the related art, on a surface of the LN substrate of the optical modulation element 102, for example, ground electrodes 122a, 122b, 122c, 122d, and 122e are provided for each of the four signal electrodes 112a, 112b, 112c, and 112d constituting a coplanar waveguide (CPW) (see FIG. 3 and not illustrated in FIG. 1).

Specifically, the ground electrodes 122a, 122b, 122c, 122d, and 122e (hereinafter, collectively also referred to as a ground electrode 122) are disposed so as to respectively sandwich the signal electrodes 112a, 112b, 112c, and 112d therebetween in the plane of the LN substrate surface, and constitute a coplanar waveguide having a predetermined characteristic impedance in a predetermined operating frequency together with the four signal electrodes 112a, 112b, 112c, and 112d.

Four high-frequency electrical signals (modulation signals) are respectively input to the four signal electrodes 112. These high-frequency electrical signals cooperate to control the propagation of the light wave in the four Mach-Zehnder type optical waveguides, and perform the operation of DP-QPSK modulation of 400 Gb/s as a whole.

The two light rays output from the optical modulation element 102 are polarized and combined by a lens optical system (not illustrated), for example, and guided to the outside of the housing 104 via the output optical fiber 110.

The housing 104 includes a case 114a to which the optical modulation element 102 is fixed and a cover 114b. In order to facilitate understanding of the configuration inside the housing 104, only a part of the cover 114b is illustrated on the left side in FIG. 1, but actually, the cover 114b is disposed to cover the entire box-shaped case 114a and hermetically seals the inside of the housing 104. The case 114a is made of a metal or a ceramic plated with gold, for example, and functions electrically as an electrical conductor. The housing 104 is usually provided with a plurality of pins for DC control or the like, which are omitted in FIG. 1.

In the case 114a, electrical connectors 116a, 116b, 116c, and 116d (hereinafter, collectively also referred to as electrical connectors 116), which are coaxial connectors including signal input terminals 124a, 124b, 124c, and 124d (hereinafter, collectively also referred to as a signal input terminal 124) that input the high-frequency electrical signal to be applied to each of the signal electrodes 112a, 112b, 112c, and 112d of the optical modulation element 102 are provided. Each of the signal input terminals 124 is electrically connected to one end of each of the signal electrodes 112 of the optical modulation element 102, via a relay substrate 118.

The other end of the signal electrode 112 of the optical modulation element 102 is terminated by a terminator 120 having a predetermined impedance. Thus, the electrical signals input to the one ends of the signal electrodes 112 respectively propagate in the signal electrodes 112 as traveling waves.

Each of the electrical connectors 116 is, for example, a socket of a push-on type coaxial connector. The cylindrical ground conductors of these electrical connectors 116 are electrically connected and fixed to the case 114a. Therefore, the case 114a corresponds to a structure connected to the ground potential. The signal input terminals 124 are configured with, for example, center conductors (core wires) extending along the cylindrical center lines of the ground conductors in respective connector sockets that are the electrical connectors 116.

Figure 3:
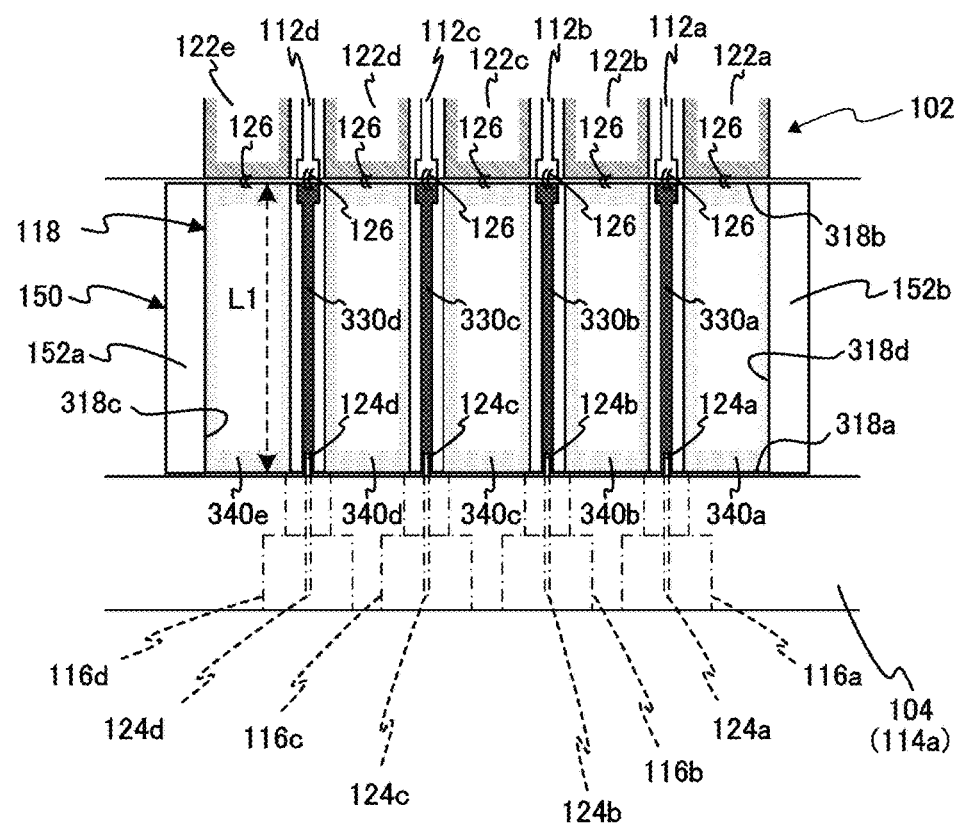
FIG. 3 is a detailed view of a part A of the optical modulator illustrated in FIG. 1.

FIG. 3 is a partial detail view of a part A in FIG. 1, and illustrates a configuration of the relay substrate 118 and its surroundings. On the relay substrate 118, signal conductor pattern 330a, 330b, 330c, and 330d (hereinafter, collectively also referred to as a signal conductor pattern 330) and ground conductor pattern 340a, 340b, 340c, 340d, and 340e (hereinafter, collectively also referred to as a ground conductor pattern 340) are formed.

The ground conductor patterns 340a, 340b, 340c, 340d, and 340e are provided so as to sandwich the respective signal conductor patterns 330a, 330b, 330c, and 330d in a front surface (a surface illustrated in FIG. 3) of the relay substrate 118. Thus, each of the signal conductor patterns 330 and the ground conductor pattern 340 form a coplanar waveguide.

Each of the signal electrodes 112 of the optical modulation element 102 is electrically connected to one end of the signal conductor pattern 330 of the relay substrate 118, by wire bonding using a conductor wire 126, for example. Here, the conductor wire 126 can be a gold wire, for example.

Further, in the optical modulation element 102, the respective ground electrodes 122 that constitute the coplanar waveguide together with the signal electrodes 112 are electrically connected to one ends of the respective ground conductor patterns 340 of the relay substrate 118, by wire bonding using the conductor wires 126, for example, in the same manner as described above. The wire bonding using the conductor wire 126 described above is an example, and the present invention is not limited to this. Instead of wire bonding of the conductor wire 126, for example, ribbon bonding using a conductor ribbon such as a gold ribbon can be used.

Here, the relay substrate 118 is mounted on the substrate carrier 150, which is configured separately from the housing 104, and is accommodated in the housing 104. The substrate carrier 150 may be made of, for example, a metal such as Kovar, and a layer such as gold (Au) may be formed on the surface thereof.

Figure 4:
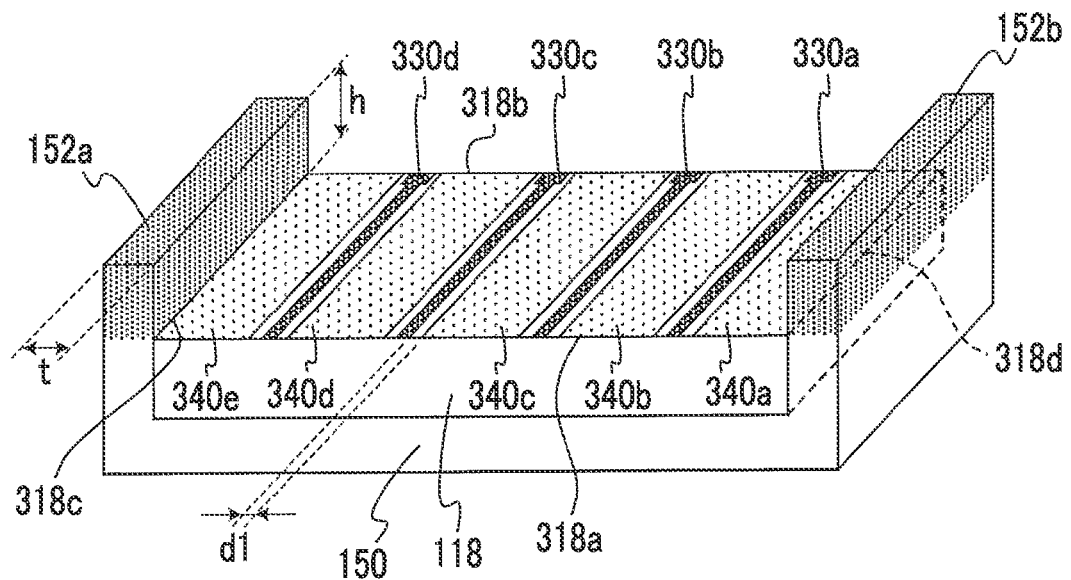
FIG. 4 is a perspective view of a relay substrate mounted on a substrate carrier in the optical modulator illustrated in FIG. 1.

FIG. 4 is a partial detail view illustrating the relay substrate 118 and the substrate carrier 150 illustrated in FIGS. 1 and 3 by extracting them, and is a perspective view of the extracted portion as viewed from the side on which the signal input terminals 124 are arranged.

In the present embodiment, in particular, the substrate carrier 150 has a U-shaped cross section, the relay substrate 118 is mounted on a bottom portion of the U-shape, and the two U-shaped arm portions constitute two electromagnetic wave propagation suppressing units 152a and 152b (hatched portions illustrated in FIG. 4) having heights protruding from the front surface of the relay substrate 118. That is, in the present embodiment, the electromagnetic wave propagation suppressing units 152a and 152b are made of, for example, the same material (for example, metal) as the substrate carrier 150.

Further, among sides of the relay substrate 118, a signal input side 318a, which is a side on which the signal conductor pattern 330 is connected to the signal input terminal 124, and a signal output side 318b, which is a side on which the signal conductor pattern 330 is connected to the signal electrode 112 of the optical modulation element 102 face each other in a plan view. The electromagnetic wave propagation suppressing units 152a and 152b are formed along the left and right side edges (lateral sides) 318c and 318d illustrated in FIG. 4, which are two sides that connect an end portion of the signal input side 318a and an end portion of the signal output side 318b in a plan view, among the sides of the relay substrate 118.

Here, in the relay substrate 118, for example, a conductor is formed on a rear surface facing the front surface, and the conductor and a bottom surface of the substrate carrier 150 are fixed by solder, a brazing material, a conductive adhesive, or the like. In the same manner, the substrate carrier 150 is fixed to the housing 104 with solder, a brazing material, a conductive adhesive, or the like. The housing 104 is grounded to a ground potential via the electrical connector 116 and/or via an external structure to which the housing 104 is fixed (for example, an apparatus housing of an apparatus using the optical modulator 100). With this configuration, the electromagnetic wave propagation suppressing units 152a and 152b are also grounded to the ground potential.

In the optical modulator 100 having the above configuration, as described above, the electromagnetic wave propagation suppressing units 152a and 152b having heights protruding from the front surface of the relay substrate 118 are formed along the side edges 318c and 318d of the relay substrate 118. Therefore, in the optical modulator 100, even in a case where signal connection points between the signal input terminals 124 and the signal conductor pattern 330 scattered at the signal input side 318a act as point wave sources of leaked microwaves, propagation of diffracted waves of the leaked microwaves from their point source to the side edges 318c and 318d along the front surface of the relay substrate 118, that is, lateral leaked microwaves are suppressed or blocked by the electromagnetic wave propagation suppressing units 152a and 152b. As a result, in the optical modulator 100, even in a case where the optical modulation element 102 operates at a transmission rate exceeding, for example, 400 Gb/s, appropriate optical modulation characteristics can be ensured by preventing crosstalk deterioration between transmission lines on the relay substrate 118 (that is, between the signal conductor patterns 330) caused by the lateral leaked microwave.

Further, in the present embodiment, since the relay substrate 118 is accommodated and fixed in the housing 104 via the substrate carrier 150, even in a case where a difference in linear expansion coefficient between the relay substrate 118 and the housing 104 is large, the substrate carrier 150 can be used as a thermal stress relaxation structure between the relay substrate 118 and the housing 104 to prevent excessive stress from being generated on the relay substrate 118 due to environmental temperature fluctuations and the like. For example, in a case where alumina ceramic is used as the relay substrate 118 and SUS is used as the housing 104, for the substrate carrier 150, a material having an intermediate coefficient of linear expansion of 50 alloys (Ni50 and Fe Bal.) or 476 alloys (Ni47, Cr6, and Fe Bal.) can be used.

According to the findings of the inventor of the present invention, from the viewpoint of the effect of suppressing the propagation of the lateral leaked microwaves, heights h (FIG. 4) of the electromagnetic wave propagation suppressing units 152a and 152b measured from the front surface of the relay substrate 118 are desirable to be equal to or higher than a clearance d1 between the signal conductor pattern 330 formed on the relay substrate 118 and the ground conductor pattern 340 adjacent to the signal conductor pattern 330 (that is, h d1) in a case where an electrical signal input from the signal input terminal 124 has a frequency in a microwave bandwidth. Here, in a case where clearances of all the adjacent signal conductor pattern 330 and ground conductor pattern 340 formed on the relay substrate 118 are not the same, the clearance d1 can be the minimum value of clearances between the adjacent signal conductor pattern 330 and ground conductor pattern 340.

This is because the high-frequency electrical signal in the microwave bandwidth propagating in the signal conductor pattern 330 on the relay substrate 118 behaves as a wave having an electromagnetic field distribution having a spread approximately equal to the clearance d1 with the adjacent ground conductor pattern 340. It is considered that a structure having at least a size of the clearance d1 gives a significant fluctuation to an electromagnetic field distribution even with respect to the leaked electrical signal wave.

Thicknesses t of the electromagnetic wave propagation suppressing units 152a and 152b may be a thickness with which the lateral leaked microwaves can be absorbed. For example, even when the thickness is approximately 10 µm, the effect of sufficiently suppressing the propagation of the lateral leaked microwaves is obtained.

In the present embodiment, the electromagnetic wave propagation suppressing units 152a and 152b are provided along the side edges 318c and 318d of the relay substrate 118, respectively, but the present embodiment is not limited to this. Depending on propagation directions and generation intensity of the lateral leaked microwave, the degree of influence on an operation of the optical modulation element 102, and the like, the electromagnetic wave propagation suppressing unit may be configured to include heights protruding from the front surface of the relay substrate 118 along at least one side (for example, at least one of the side edges 318c and 318d in the present embodiment) connecting the respective end portions of the signal input side 318a and the signal output side 318b facing each other in a plan view, among the sides of the relay substrate 118.

Next, modification examples of the optical modulator 100 according to the first embodiment will be described.

First Modification Example of First Embodiment

Figure 5:
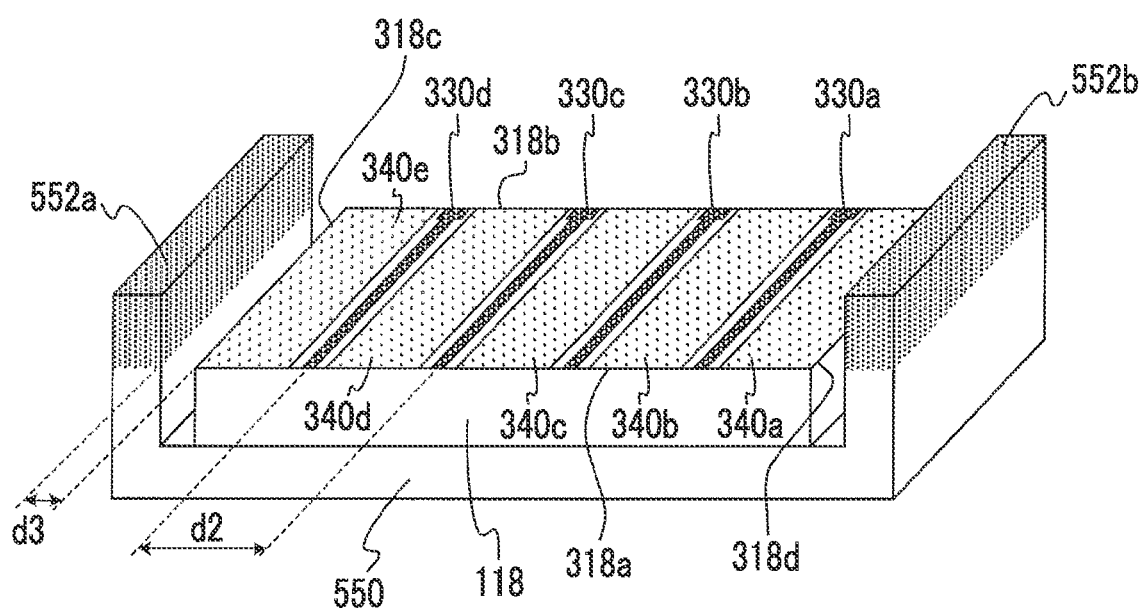
FIG. 5 is a perspective view illustrating a configuration of an electromagnetic wave propagation suppressing unit according to a first modification example of the optical modulator according to the first embodiment.

FIG. 5 is a diagram illustrating a configuration of electromagnetic wave propagation suppressing units 552a and 552b according to a first modification example of the first embodiment, and is a diagram corresponding to the partial detail view of the first embodiment illustrated in FIG. 4. A substrate carrier 550 including the electromagnetic wave propagation suppressing units 552a and 552b can be used in place of the substrate carrier 150 in the optical modulator 100 illustrated in FIG. 1. In FIG. 5, the same reference numerals as those in FIG. 4 are used for the same components as those of the components illustrated in FIG. 4, and the above description of FIG. 4 is adopted.

The substrate carrier 550 illustrated in FIG. 5 has a U-shaped cross section in the same manner as the substrate carrier 150 illustrated in FIG. 4, but has a difference in that the electromagnetic wave propagation suppressing units 552a and 552b constituting a U-shaped arm portion are respectively provided so as to be separated from the side edges 318c and 318d of the relay substrate 118 arranged at a bottom portion of the U-shape in a plan view.

In this manner, even in a case where a space having a width of a separation distance d3 is formed between the side edges 318c and 318d of the relay substrate 118 and the electromagnetic wave propagation suppressing units 552a and 552b, it is possible to suppress propagation of lateral leaked microwaves. If the separation distance d3 is too wide, the effect of suppressing the propagation of the lateral leaked microwaves is reduced, so that the distance d3 is desirable to be at least narrower than a distance d2 between the adjacent signal conductor patterns 330 formed on the relay substrate 118 (that is, d3<d2). Here, in a case where the distances between the adjacent signal conductor patterns 330 are different from each other, the distance d2 can be the maximum value among the distances between the adjacent signal conductor patterns 330.

Figure 6:
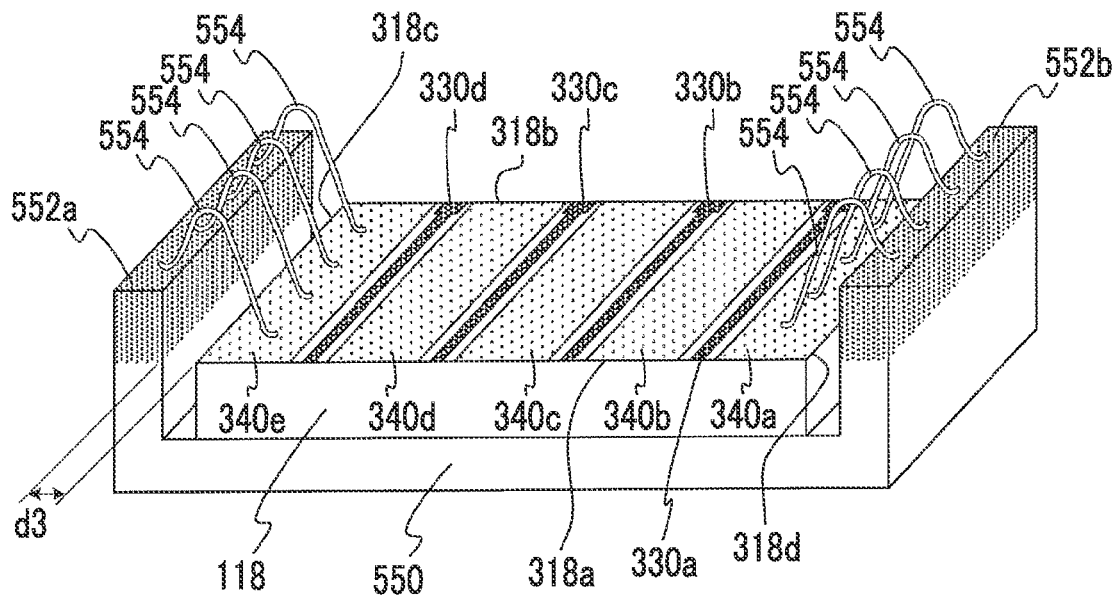
FIG. 6 is a perspective view illustrating an example of an appropriate configuration using the electromagnetic wave propagation suppressing unit according to the first modification example illustrated in FIG. 5.

In a case where formation positions of the electromagnetic wave propagation suppressing units 552a and 552b are separated from the side edges 318c and 318d of the relay substrate 118 in a plan view as in the present modification example, as illustrated in FIG. 6, by connecting the electromagnetic wave propagation suppressing units 552a and 552b to the ground conductor pattern 340 of the relay substrate 118 with conductor wires 554, the connection between the electromagnetic wave propagation suppressing units 552a and 552b and the ground line can be strengthened, and the effect of suppressing the propagation of the lateral leaked microwaves can be enhanced. For example, in a case where the separation distance d3 cannot be set to the above-described preferable distance range (d3<d2) at a design stage, due to restrictions on a tool size of a wire bonder used to connect the signal conductor pattern 330 on the relay substrate 118 and the signal electrode 112 of the optical modulation element 102, and the like, this configuration can be used to enhance the effect of suppressing the propagation of lateral leaked microwaves by the electromagnetic wave propagation suppressing units 552a and 552b. That is, the configuration illustrated in FIG. 6 can flexibly enhance the effect of suppressing the propagation of the lateral leaked microwaves by the electromagnetic wave propagation suppressing units 552a and 552b in a manufacturing process of the optical modulator 100.

Second Modification Example of First Embodiment

Figure 7:
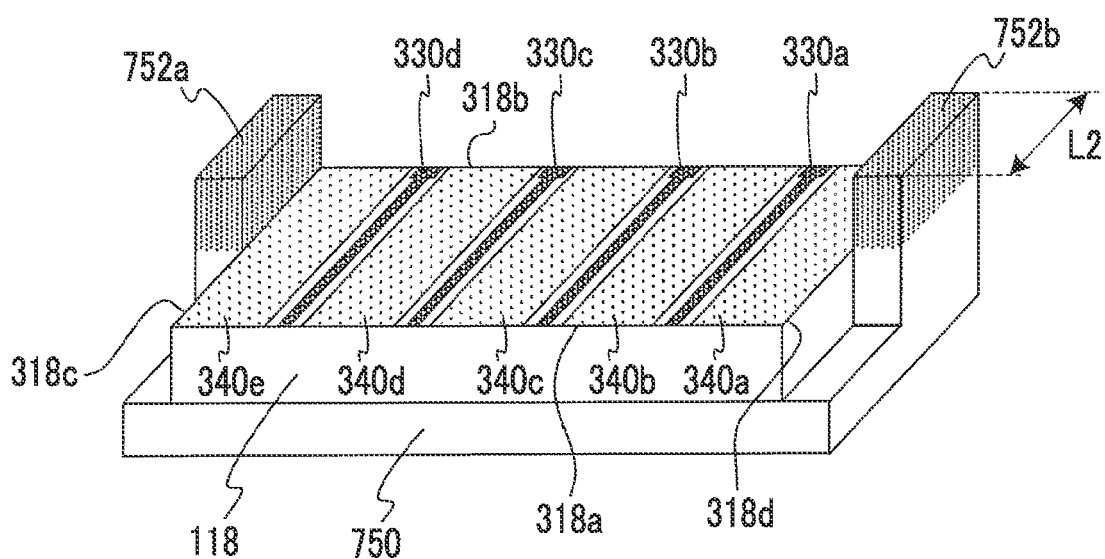
FIG. 7 is a perspective view illustrating a configuration of an electromagnetic wave propagation suppressing unit according to a second modification example of the optical modulator according to the first embodiment.

FIG. 7 is a diagram illustrating a configuration of electromagnetic wave propagation suppressing units 752a and 752b according to a second modification example of the first embodiment, and is a diagram corresponding to the partial detail view of the first embodiment illustrated in FIG. 4. A substrate carrier 750 including the electromagnetic wave propagation suppressing units 752a and 752b can be used in place of the substrate carrier 150 in the optical modulator 100 illustrated in FIG. 1. In FIG. 7, the same reference numerals as those in FIG. 4 are used for the same components as those of the components illustrated in FIG. 4, and the above description of FIG. 4 is adopted.

The substrate carrier 750 illustrated in FIG. 7 has a U-shaped cross section in the same manner as the substrate carrier 150 illustrated in FIG. 4, but has a difference in that the electromagnetic wave propagation suppressing units 752a and 752b (hatched portions illustrated in FIG. 7) constituting a U-shaped arm portion are respectively formed shorter than a length of the side edges 318c and 318d of the relay substrate 118, extending from an end portion on a side on which the optical modulation element 102 is disposed, in the substrate carrier 750.

As described above, even when the electromagnetic wave propagation suppressing units 752a and 752b have lengths L2 shorter than lengths L1 of the side edges 318c and 318d of the relay substrate 118, propagation of lateral leaked microwaves can be suppressed, depending on intensities and directions of the lateral leaked microwaves. In FIG. 7, the electromagnetic wave propagation suppressing units 752a and 752b having the lengths L2 shorter than the lengths L1 of the side edges 318c and 318d are provided extending from the end portion of the substrate carrier 750 on the side on which the optical modulation element 102 is located, but the present invention is not limited to this. The electromagnetic wave propagation suppressing units 752a and 752b having the lengths L2 shorter than the lengths L1 of the side edges 318c and 318d can be arranged at any positions between respective ends of the side edges 318c and 318d. With this arrangement, the influence of the lateral leaked microwaves on the operation of the optical modulation element 102 also can be characterized to some extent. However, in a case where the electromagnetic wave propagation suppressing unit having the length L2 shorter than the length L1 of the side edges 318c and 318d is provided in this manner, from the viewpoint that the influence of the lateral leaked microwaves on the operation of the optical modulation element 102 is effectively prevented, as illustrated in FIG. 7, it is desirable that the electromagnetic wave propagation suppressing units 752a and 752b are provided to extend from the end portion on the side on which the optical modulation element 102 is located, in the substrate carrier 750.

Figure 23:
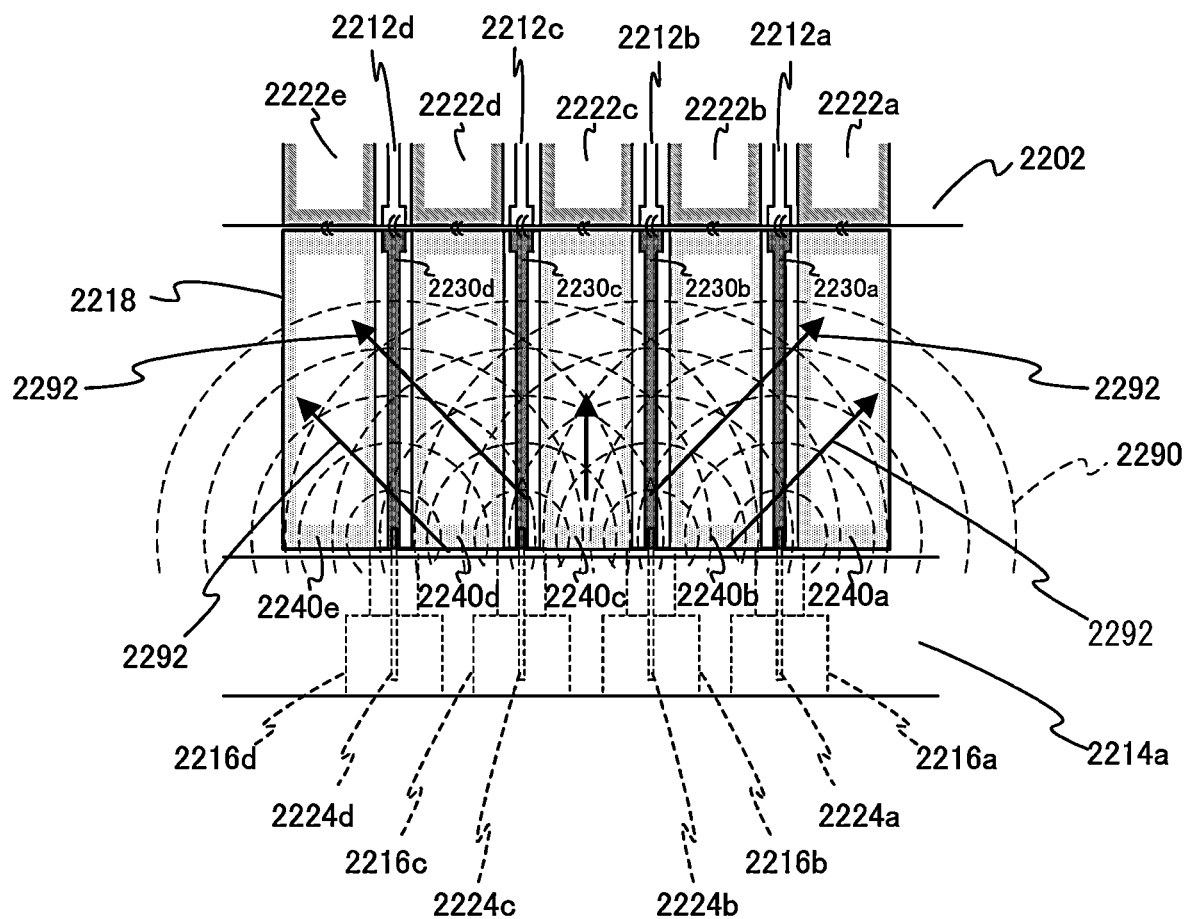
FIG. 23 is an explanatory diagram for explaining a generation of lateral leaked microwaves in the optical modulator in the related art.

The lateral leaked microwave generated in the relay substrate 118 propagates obliquely toward the side edges 318c and 318d of the relay substrate 118 while heading toward the optical modulation element 102, as illustrated as the diffracted wave 2292 in FIG. 23. Therefore, in a case where it is difficult to form the electromagnetic wave propagation suppressing unit having a height protruding from the front surface of the relay substrate 118 along the entire side edges 318c and 318d due to design and manufacturing constraint conditions and the like, by providing the electromagnetic wave propagation suppressing units 752a and 752b extending from the side of the optical modulation element 102 (that is, the side of the signal output side 318b) along the side edges 318c and 318d of the relay substrate 118 over the length L2 (<L1), a large suppression effect can be obtained for lateral leaked microwave propagation.

Here, the lengths L2 of the electromagnetic wave propagation suppressing units 652a and 652b are preferably longer than ⅕ of the length L1 of the relay substrate 118 (FIG. 3), that is, a distance from the signal input side 318a to the signal output side 318b, and if the length L2 is equal to or higher than ½, a greater effect is obtained.

Third Modification Example of First Embodiment

Figure 8:
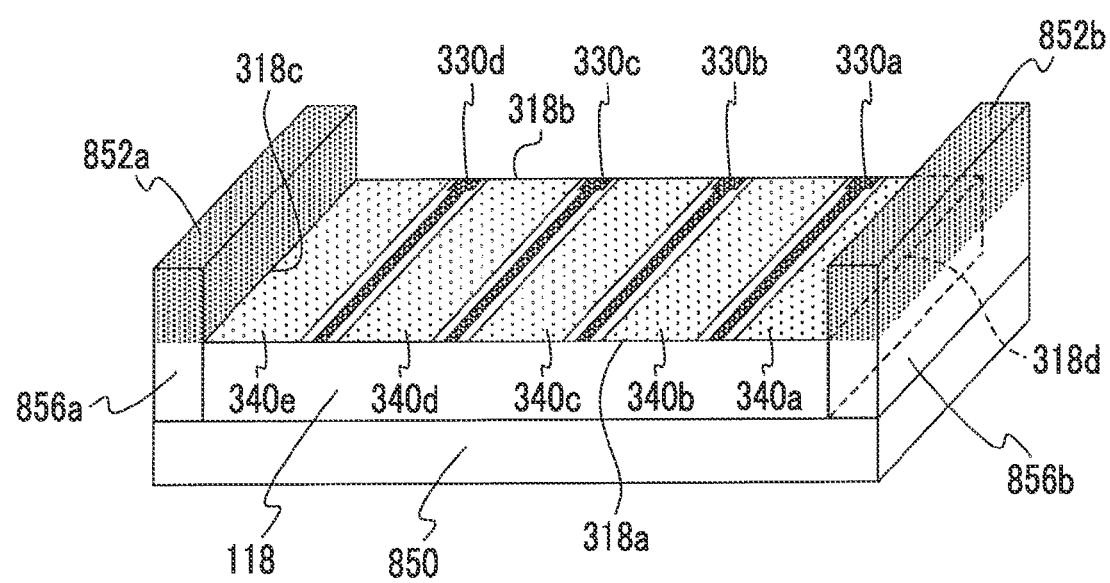
FIG. 8 is a perspective view illustrating a configuration of an electromagnetic wave propagation suppressing unit according to a third modification example of the optical modulator according to the first embodiment.

FIG. 8 is a diagram illustrating a configuration of electromagnetic wave propagation suppressing units 852a and 852b according to a third modification example of the first embodiment, and is a diagram corresponding to the partial detail view of the first embodiment illustrated in FIG. 4. A substrate carrier 850 including the electromagnetic wave propagation suppressing units 852a and 852b can be used in place of the substrate carrier 150 in the optical modulator 100 illustrated in FIG. 1. In FIG. 8, the same reference numerals as those in FIG. 4 are used for the same components as those of the components illustrated in FIG. 4, and the above description of FIG. 4 is adopted.

Unlike the U-shaped substrate carrier 150 illustrated in FIG. 4, the substrate carrier 850 illustrated in FIG. 8 is configured as a flat plate, and the relay substrate 118 is mounted on the flat plate. Further, two supports 856a and 856b provided along the side edges 318c and 318d of the relay substrate 118 are fixed in the respective vicinities of a pair of opposite sides on the flat plate constituting the substrate carrier 850. In the supports 856a and 856b, portions (hatched portions in FIG. 8) protruding from the front surface of the relay substrate 118 constitute the electromagnetic wave propagation suppressing units 852a and 852b arranged along the side edges 318c and 318d.

Here, the supports 856a and 856b may be configured with one material as a whole, or may be configured with a combination of a plurality of materials. For example, in the supports 856a and 856b, the portion constituting the electromagnetic wave propagation suppressing units 852a and 852b and the other portions can be made of different materials. In addition to metal, these materials may be electromagnetic wave absorbing materials such as ferrite.

In the same manner as the electromagnetic wave propagation suppressing units 152a and 152b illustrated in FIG. 4, the electromagnetic wave propagation suppressing units 852a and 852b illustrated in FIG. 8 also can effectively suppress propagation of lateral leaked microwaves generated from the connection point between the signal conductor pattern 330 and the signal input terminal 124 on the signal input side 318a.

Fourth Modification Example of First Embodiment

Figure 9:
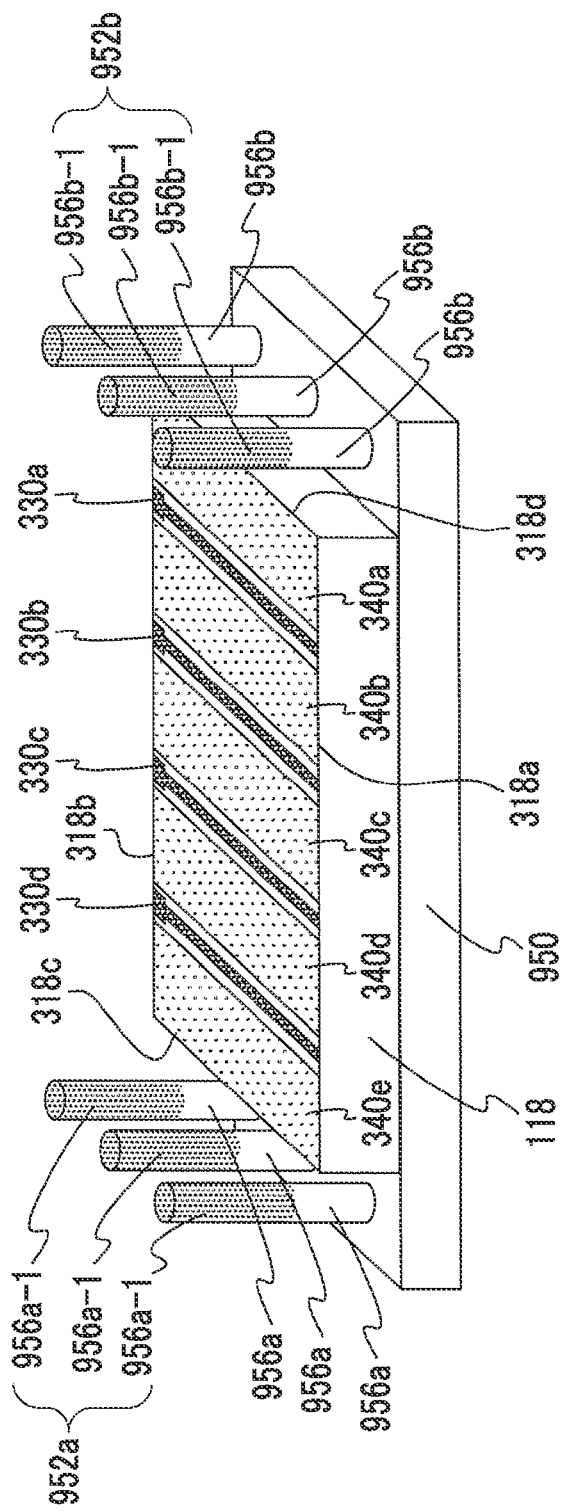
FIG. 9 is a perspective view illustrating a configuration of an electromagnetic wave propagation suppressing unit according to a fourth modification example of the optical modulator according to the first embodiment.

FIG. 9 is a diagram illustrating a configuration of electromagnetic wave propagation suppressing units 952a and 952b according to a fourth modification example of the first embodiment, and is a diagram corresponding to the partial detail view of the first embodiment illustrated in FIG. 4. A substrate carrier 950 including the electromagnetic wave propagation suppressing units 952a and 952b can be used in place of the substrate carrier 150 in the optical modulator 100 illustrated in FIG. 1. In FIG. 9, the same reference numerals as those in FIG. 4 are used for the same components as those of the components illustrated in FIG. 4, and the above description of FIG. 4 is adopted.

Unlike the U-shaped substrate carrier 150 illustrated in FIG. 4, the substrate carrier 950 illustrated in FIG. 9 is configured as a flat plate, and the relay substrate 118 is mounted on the flat plate. Further, three columnar pins 956a and 956b are fixed along the side edges 318c and 318d of the relay substrate 118 in the respective vicinities of a pair of opposite sides, on the flat plate constituting the substrate carrier 950. In the three pins 956a and 956b, respectively, three protruding portions 956a-1 and 956b-1 (hatched portions in FIG. 9) protruding from the front surface of the relay substrate 118 constitute the electromagnetic wave propagation suppressing units 952a and 952b arranged along the side edges 318c and 318d.

By setting a clearance between the adjacent pins 956a and a clearance between the adjacent pins 956b to be equal to or lower than a wavelength of a high-frequency signal input from the signal input terminal 124, the electromagnetic wave propagation suppressing units 952a and 952b illustrated in FIG. 9 function as shields against electromagnetic waves having the wavelength, and can effectively suppress the propagation of lateral leaked microwaves, in the same manner as the electromagnetic wave propagation suppressing units 152a and 152b illustrated in FIG. 4.

Here, the pins 956a and 956b may be configured with one material as a whole, or may be configured with a combination of a plurality of materials. For example, in the pins 956a and 956b, the portion constituting the electromagnetic wave propagation suppressing units 952a and 952b (that is, the protruding portions 956a-1 and 956b-1) and the other portions can be made of different materials. In addition to metal, these materials may be electromagnetic wave absorbing materials such as ferrite.

Further, in the example illustrated in FIG. 9, the pins 956a and 956b have simple columnar shapes, but the present invention is not limited to this. Each of the pins 956a and 956b may have an axisymmetric shape and have a substantially columnar shape, and can have a shape in which a small diameter portion and a large diameter portion are mixed to form one pin, for example.

Second Embodiment

Figure 10:
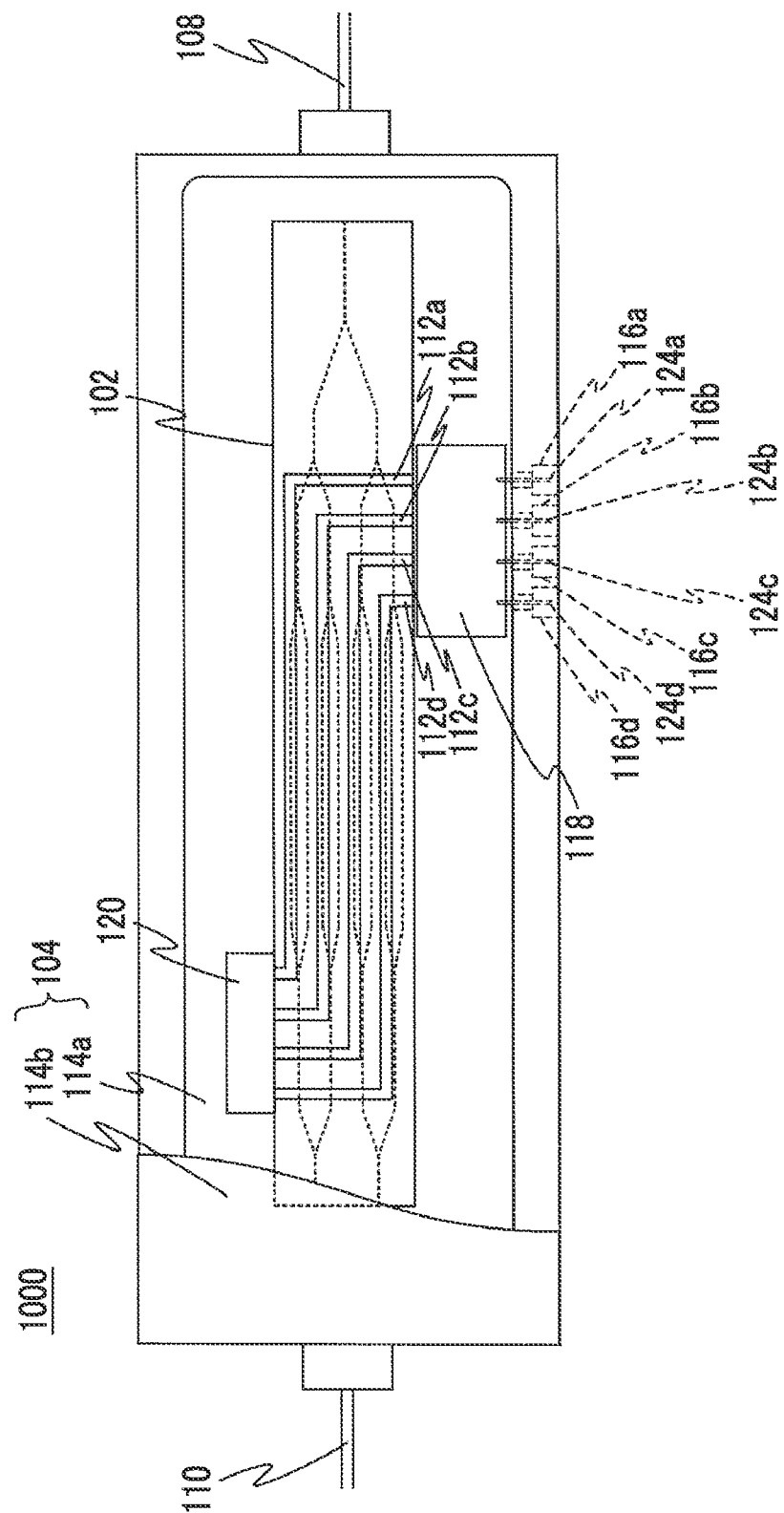
FIG. 10 is a plan view of an optical modulator according to a second embodiment of the present invention.

Next, an optical modulator 1000 according to a second embodiment of the present invention will be described. FIG. 10 is a diagram illustrating a configuration of the optical modulator 1000. In FIG. 10, the same reference numerals as those in FIG. 1 are used for the same components as those of the components of the optical modulator 100 illustrated in FIG. 1, and the above description of FIG. 1 is adopted. The optical modulator 1000 illustrated in FIG. 10 has the same structure as the optical modulator 100, but has a difference in that the relay substrate 118 is fixed directly to the housing 104 without passing through the substrate carrier configured separately from the housing 104. The optical modulator 1000 is different from the optical modulator 100 in that the electromagnetic wave propagation suppressing unit is not provided on the substrate carrier but is provided on the relay substrate 118.

Figure 11:
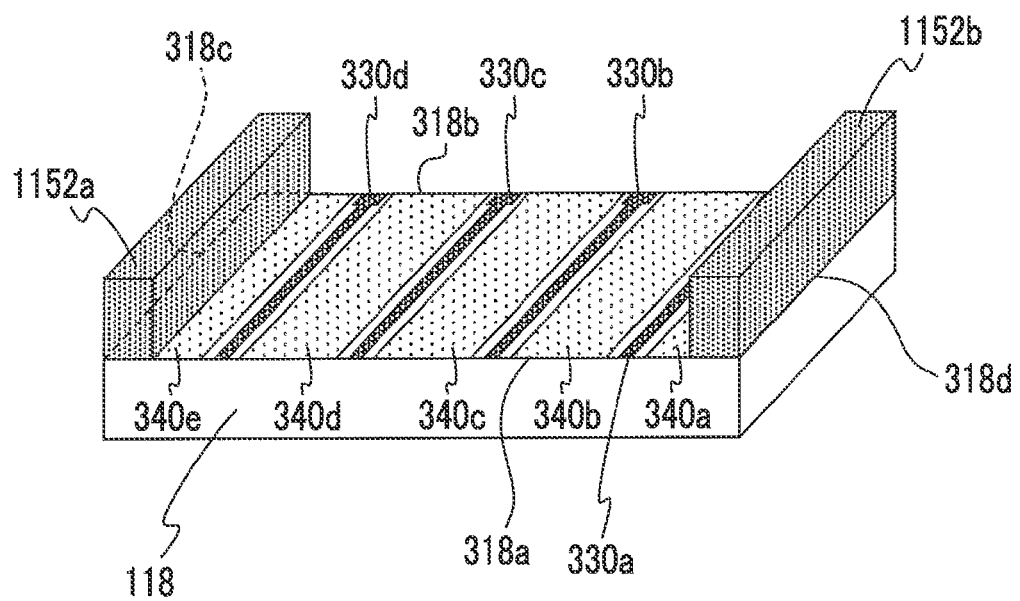
FIG. 11 is a perspective view illustrating a configuration of an electromagnetic wave propagation suppressing unit in the optical modulator illustrated in FIG. 10.

FIG. 11 is a diagram illustrating a configuration of the relay substrate 118, and is a diagram corresponding to FIG. 4 in the first embodiment. In FIG. 11, the same reference numerals as those in FIG. 4 are used for the same components as those of the components illustrated in FIG. 4, and the above description of FIG. 4 is adopted.

In the optical modulator 1000, as illustrated in FIG. 11, electromagnetic wave propagation suppressing units 11152a and 1152b are respectively arranged, along the side edges 318c and 318d, on the ground conductor patterns 340a and 340b respectively formed along the side edges 318c and 318d, on the relay substrate 118. Here, the electromagnetic wave propagation suppressing units 1152a and 1152b may be made of, for example, an electromagnetic wave absorbing material such as metal or ferrite.

Since the electromagnetic wave propagation suppressing units 1152a and 1152b of the present embodiment are provided on the relay substrate 118, as compared with the electromagnetic wave propagation suppressing units 152a and 152b provided outside the relay substrate 118 as in the first embodiment, it is possible to effectively suppress propagation of lateral leaked microwaves near generation sources of the lateral leaked microwaves (a connection point between the signal conductor pattern 330 of the relay substrate 118 and the signal input terminal 124). Further, in the present embodiment, since the electromagnetic wave propagation suppressing units 152a and 152b are not provided outside the relay substrate 118, a size of the housing 104 can be easily reduced as compared with the optical modulator 100 according to the first embodiment.

Next, modification examples of the optical modulator 1000 according to the second embodiment will be described.

First Modification Example of Second Embodiment

Figure 12:
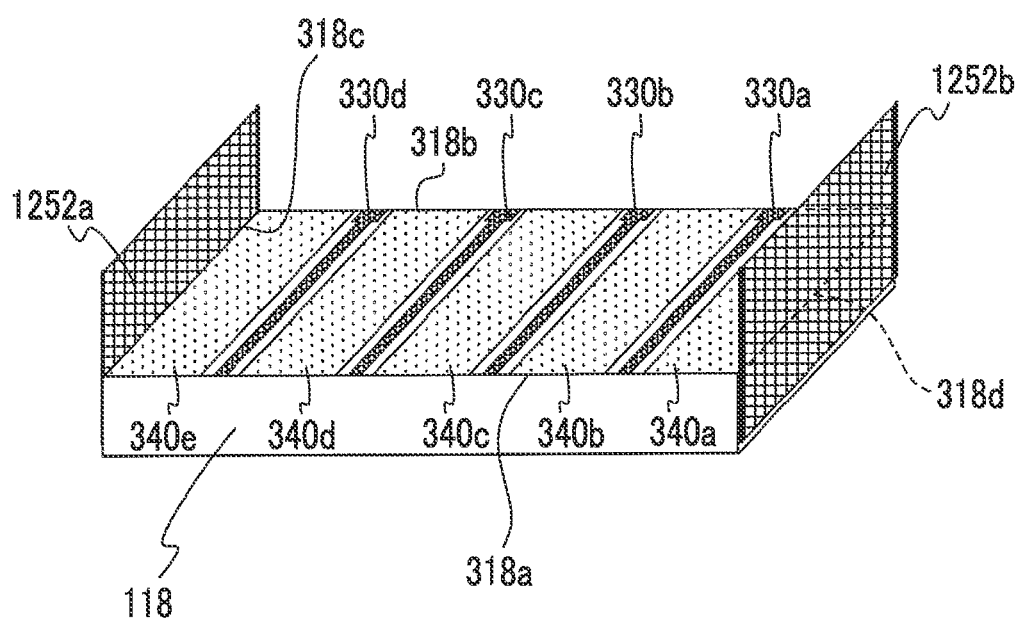
FIG. 12 is a perspective view illustrating a configuration of an electromagnetic wave propagation suppressing unit according to a first modification example of the optical modulator according to the second embodiment.

FIG. 12 is a diagram illustrating a configuration of electromagnetic wave propagation suppressing units 1252a and 1252b according to a first modification example of the second embodiment, and is a diagram corresponding to the partial detail view illustrated in FIG. 11. The relay substrate 118 including the electromagnetic wave propagation suppressing units 1252a and 1252b can be used in the optical modulator 1000 illustrated in FIG. 12 in place of the relay substrate 118 including the electromagnetic wave propagation suppressing units 1152a and 1152b. In FIG. 12, the same reference numerals as those in FIG. 11 are used for the same components as those of the components illustrated in FIG. 11, and the above description of FIG. 11 is adopted.

The electromagnetic wave propagation suppressing units 1252a and 1252b in the present modification example are sheet-shaped, for example, metal meshes, and are arranged along the side edges 318c and 318d, on two side surfaces of the relay substrate 118 respectively connected to the side edges 318c and 318d.

In the metal mesh constituting the electromagnetic wave propagation suppressing units 1252a and 1252b, a gap formed between metal fibers is generally sufficiently small with respect to a wavelength of a high-frequency signal input from the signal input terminal 124, so that the metal mesh constituting the electromagnetic wave propagation suppressing units 1252a and 1252b function as shields against lateral leakage microwaves and can effectively suppress propagation of the lateral leaked microwaves. As described above, a thickness of the electromagnetic wave propagation suppressing unit required to absorb the lateral leaked microwaves is sufficient to be approximately 10 μm. Therefore, the electromagnetic wave propagation suppressing units 1252a and 1252b may be made of a sheet-shaped metal mesh having a thickness of approximately 10 μm.

Second Modification Example of Second Embodiment

Figure 13:
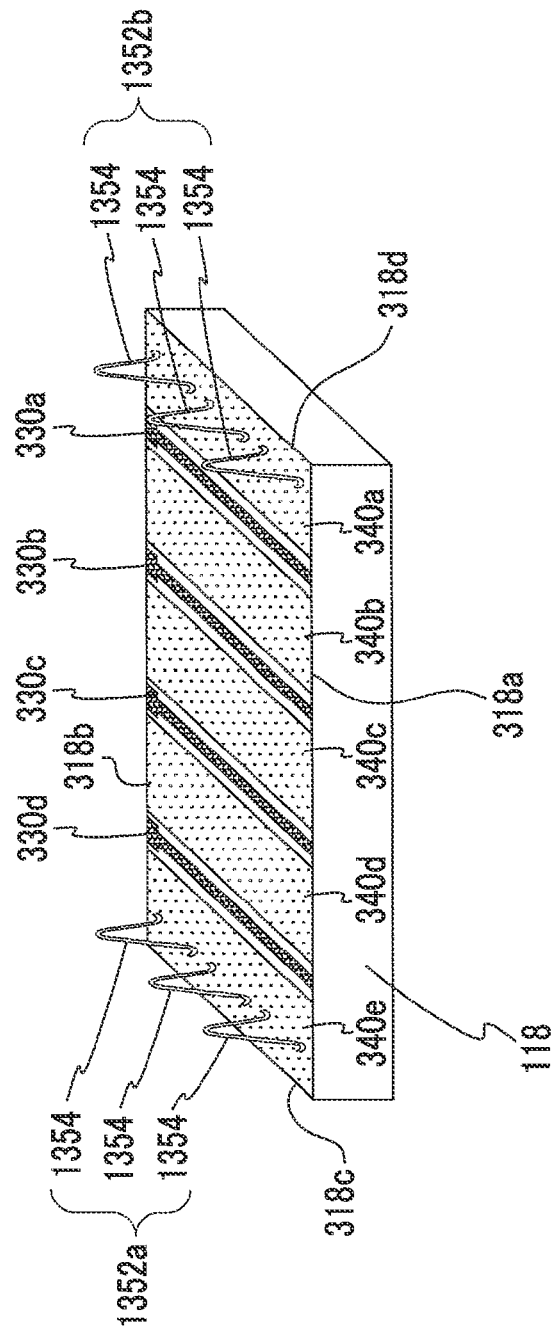
FIG. 13 is a perspective view illustrating a configuration of an electromagnetic wave propagation suppressing unit according to a second modification example of the optical modulator according to the second embodiment.

FIG. 13 is a diagram illustrating a configuration of electromagnetic wave propagation suppressing units 1352a and 1352b according to a second modification example of the second embodiment, and is a diagram corresponding to the partial detail view illustrated in FIG. 11. The relay substrate 118 including the electromagnetic wave propagation suppressing units 1352a and 1352b can be used in the optical modulator 1000 illustrated in FIG. 10 in place of the relay substrate 118 including the electromagnetic wave propagation suppressing units 1152a and 1152b. In FIG. 13, the same reference numerals as those in FIG. 11 are used for the same components as those of the components illustrated in FIG. 11, and the above description of FIG. 11 is adopted.

Each of the electromagnetic wave propagation suppressing units 1352a and 1352b in the present modification example is configured with three conductor wires 1354 provided to be erected along the side edges 318c and 318d on the ground conductor patterns 340a and 340b of the relay substrate 118 in a loop shape or a bridge shape.

In the same manner as the pins 956a and 956b constituting the electromagnetic wave propagation suppressing units 952a and 952b illustrated in FIG. 9, by setting a clearance between erected portions adjacent to each other of the conductor wires 1354 (hereinafter, an erection clearance) to be equal to or lower than a wavelength of a high-frequency signal input from the signal input terminal 124 (therefore, equal to or lower than wavelengths of lateral leaked microwaves), the erected conductor wire 1354 functions as a shield against the lateral leaked microwaves and can effectively suppress its propagation.

The number of conductor wires 1354 constituting each of the electromagnetic wave propagation suppressing units 1352a and 1352b described in the present modification example is "3" as an example, and the present modification example is not limited to this. The number of conductor wires 1354 constituting each of the electromagnetic wave propagation suppressing units 1352a and 1352b can be any number as long as the erection clearance is equal to or lower than the wavelength of the lateral leaked microwave as described above.

Figure 14:
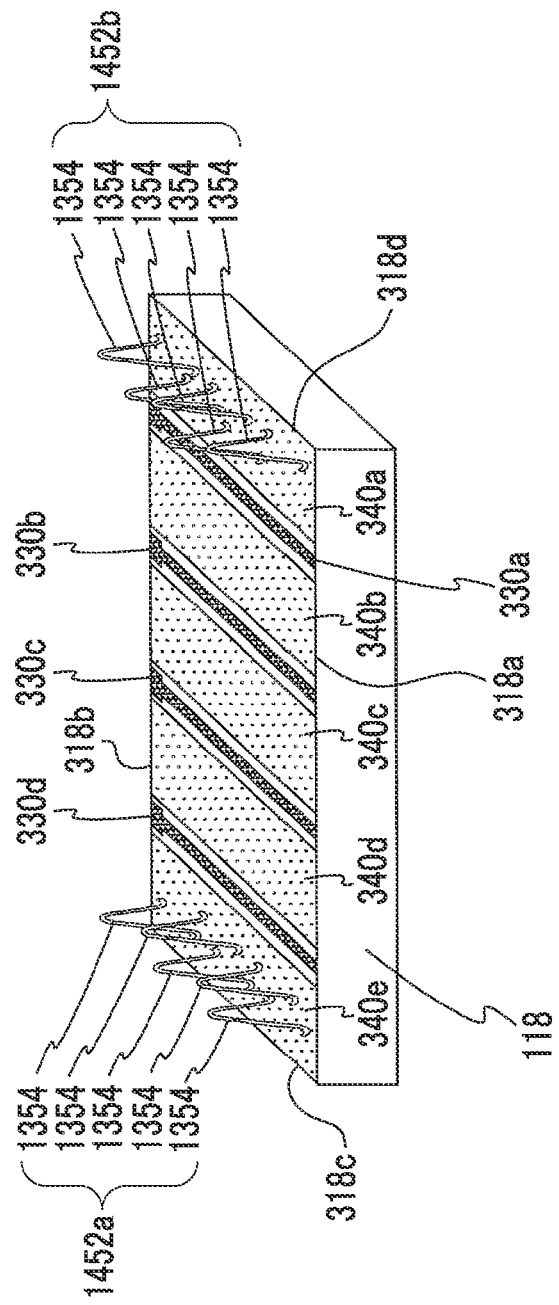
FIG. 14 is a perspective view illustrating another example of an appropriate configuration of the electromagnetic wave propagation suppressing unit according to the second modification example of the optical modulator according to the second embodiment.

Here, in FIG. 13, the conductor wires 1354 respectively constituting the electromagnetic wave propagation suppressing units 1352a and 1352b are erected in a row in a loop shape or a bridge shape along the side edges 318c and 318d as illustrated in FIG. 13, but the present invention is not limited to this. For example, as illustrated in FIG. 14, the conductor wires 1354 erected in a loop shape or a bridge shape along the side edges 318c and 318d are provided in two respective rows along the side edges 318c and 318d to form the electromagnetic wave propagation suppressing units 1452a and 1452b. However, from the viewpoint of the shielding effect against the lateral leaked microwaves, it is advantageous that the respective conductor wires 1354 provided in the two rows are arranged alternately when viewed from the side edge 318c side, as illustrated in FIG. 14.

Figure 15:
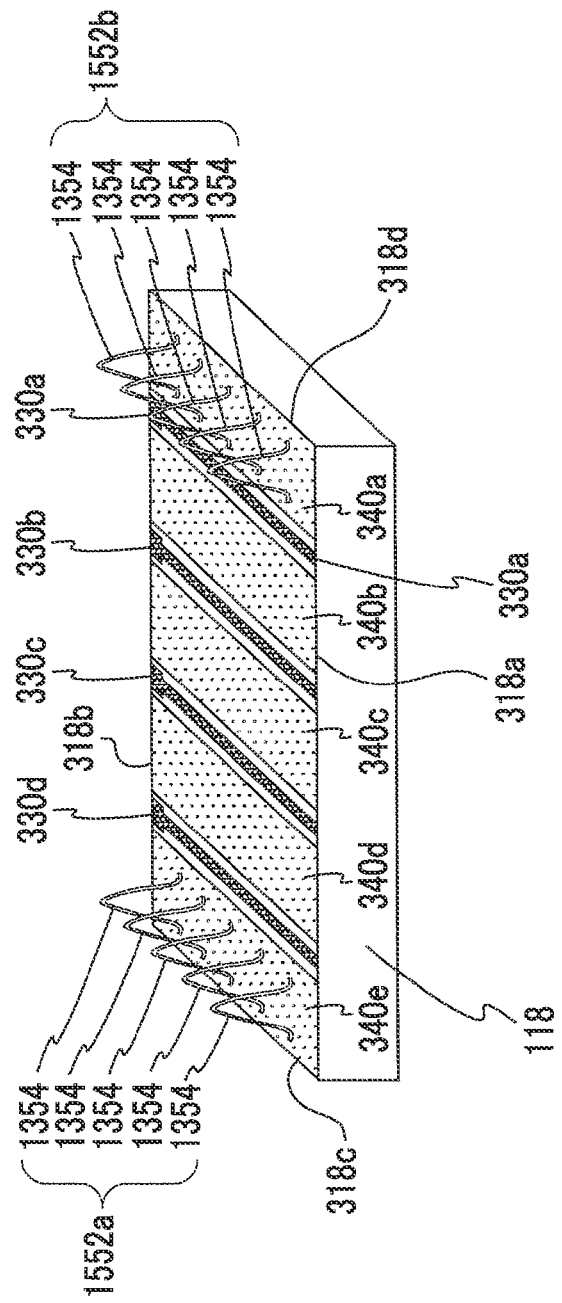
FIG. 15 is a perspective view illustrating still another example of the appropriate configuration of the electromagnetic wave propagation suppressing unit according to the second modification example of the optical modulator according to the second embodiment.

Alternatively, as illustrated in FIG. 15, the respective conductor wires 1354 are erected in a loop shape or a bridge shape along a direction orthogonal to the side edges 318c and 318d, and arranged along the side edges 318c and 318d. Therefore, the electromagnetic wave propagation suppressing units 1552a and 1552b can be respectively provided along the side edges 318c and 318d.

In the configurations illustrated in FIGS. 13, 14, and 15, the conductor wire 1354 can be a metal wire or a metal ribbon. Further, in FIGS. 13 and 14, each of the conductor wires 1354 is erected as individual wires, but the present invention is not limited to this. By connecting respective ends and one or more intermediate portions of one conductor wire to the ground conductor pattern 340a or the like, a plurality of loop-shaped or bridge-shaped erected portions may be provided with the one conductor wire. Alternatively, only one end of the individual conductor wire 1354 may be connected to the ground conductor pattern 340a or the like, and the conductor wire 1354 may be erected (for example, in a substantially straight line shape).

Third Embodiment

Figure 16:
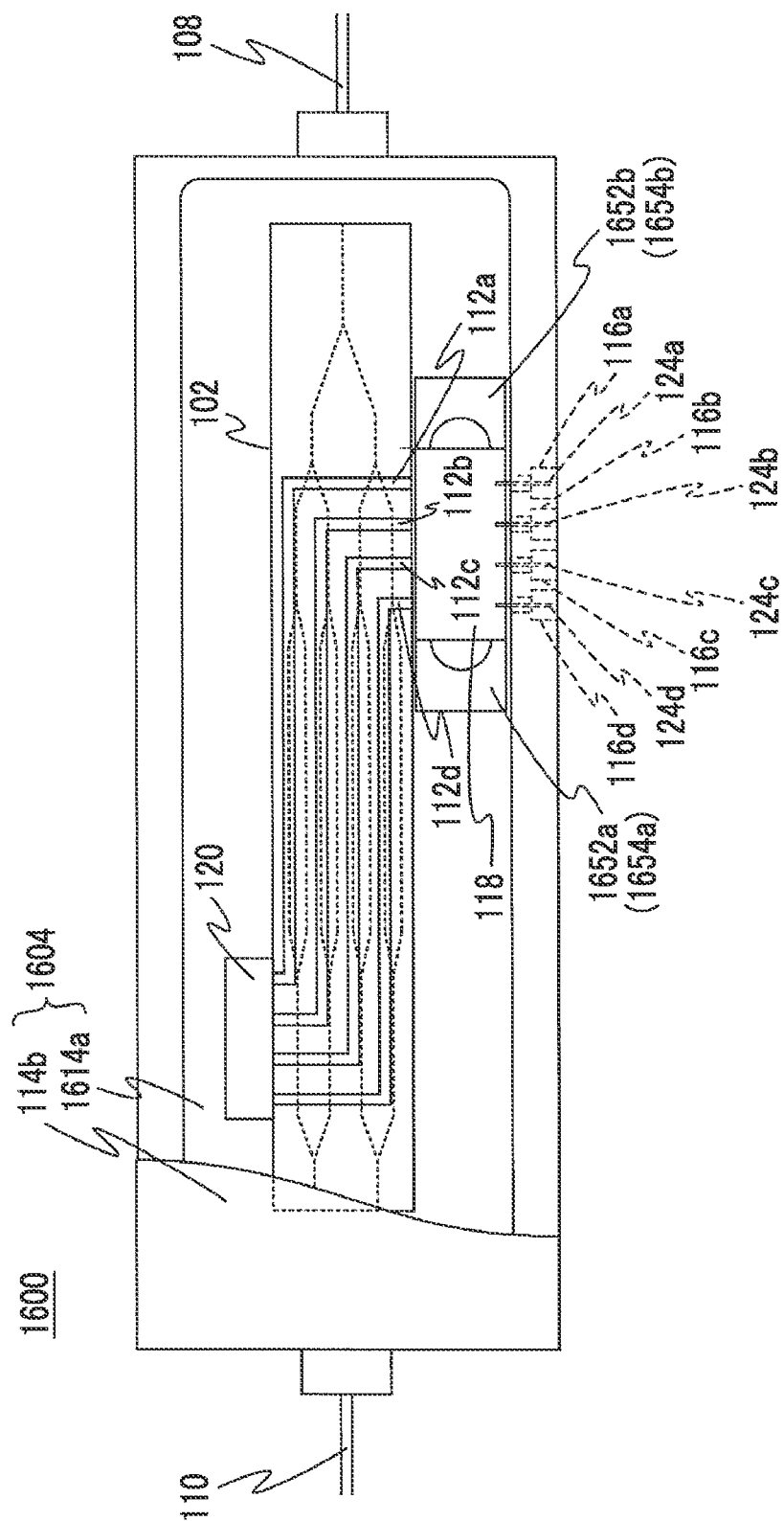
FIG. 16 is a plan view of an optical modulator according to a third embodiment of the present invention.

Next, an optical modulator 1600 according to a third embodiment of the present invention will be described. In the optical modulator 1600, an electromagnetic wave propagation suppressing unit is provided in a housing that accommodates the optical modulation element 102. FIG. 16 is a plan view illustrating a configuration of the optical modulator 1600. In FIG. 16, the same reference numerals as those in FIG. 1 are used for the same components as those of the components of the optical modulator 100 illustrated in FIG. 1, and the above description of FIG. 1 is adopted. The optical modulator 1600 illustrated in FIG. 16 has the same structure as the optical modulator 100, but has a difference in that a housing 1604 is provided in place of the housing 104. The housing 1604 has the same configuration as the housing 104, but has a difference that a case 1614a is provided instead of the case 114a.

The case 1614a has the same configuration as the case 114a, but has a difference in that protuberant portions 1654a and 1654b are provided along the side edges 318c and 318d at positions at which the relay substrate 118 is sandwiched, and parts of the protuberant portions 1654a and 1654b constitute the electromagnetic wave propagation suppressing units 1652a and 1652b.

Figure 17:
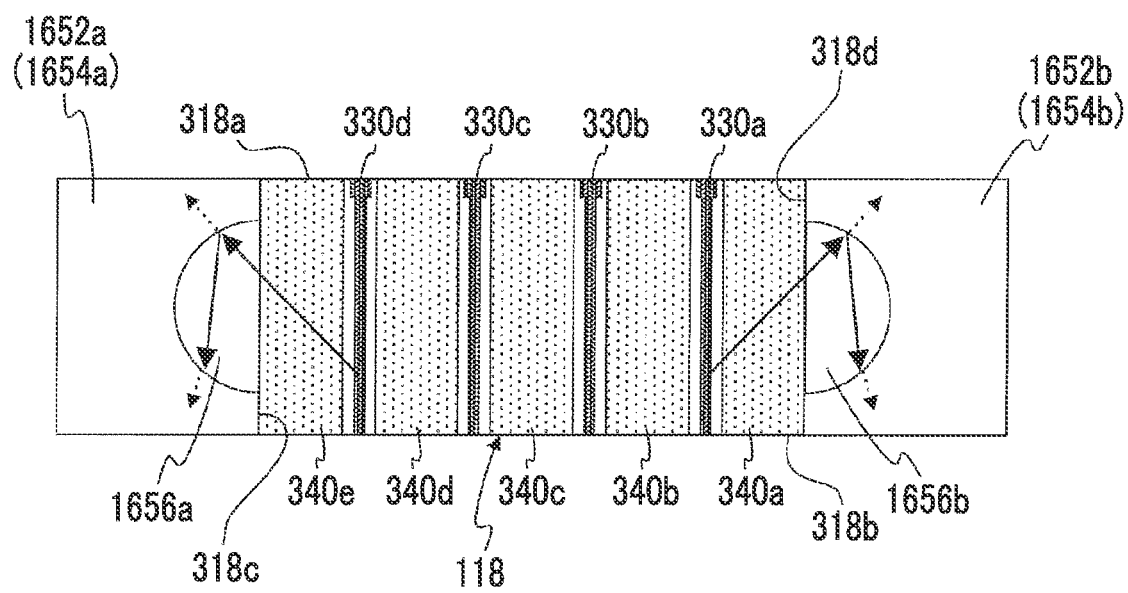
FIG. 17 is a plan view illustrating a configuration of an electromagnetic wave propagation suppressing unit in the optical modulator illustrated in FIG. 16.
Figure 18:
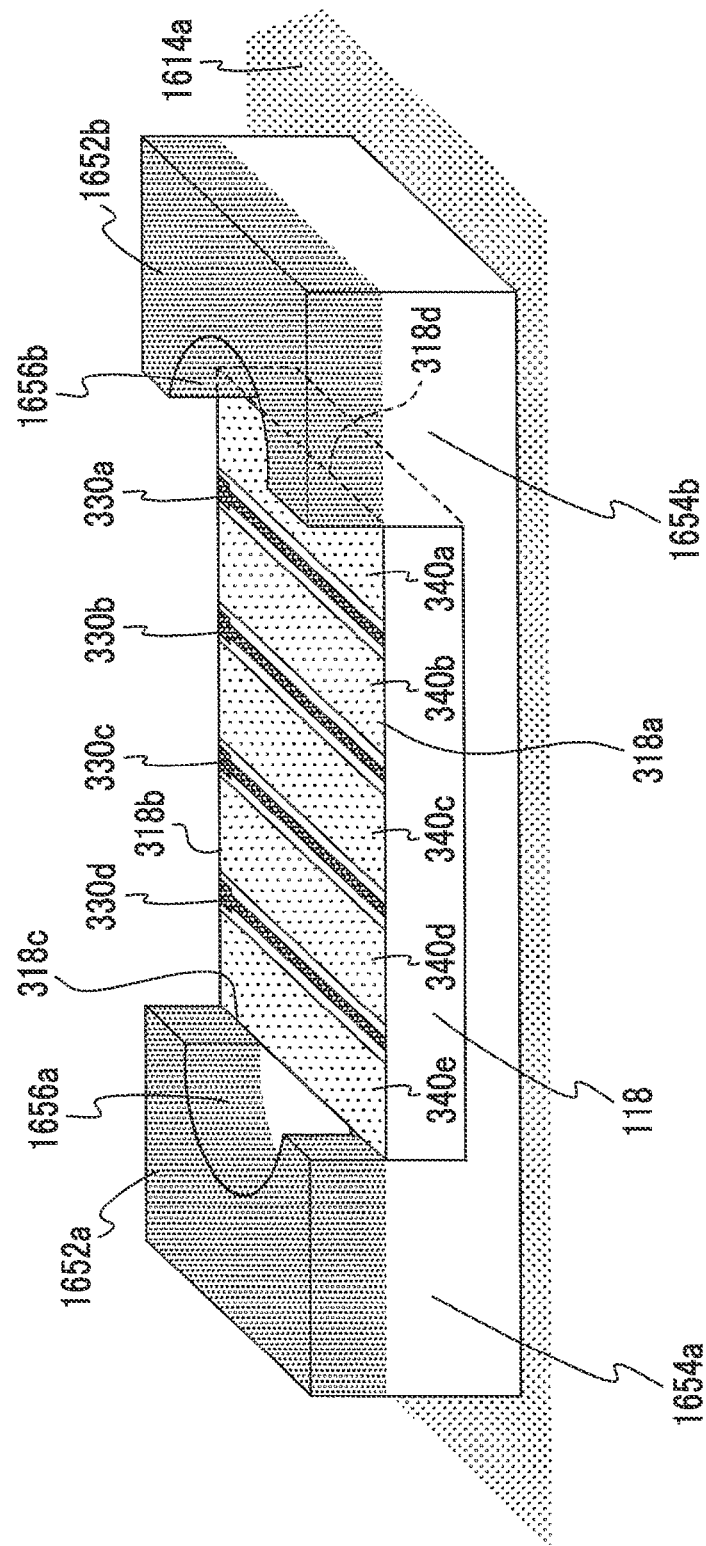
FIG. 18 is a perspective view illustrating the configuration of the electromagnetic wave propagation suppressing unit in the optical modulator illustrated in FIG. 16.

FIG. 17 is a partial detail view illustrating an extracted portion including the relay substrate 118 and the electromagnetic wave propagation suppressing units 1652a and 1652b illustrated in FIG. 16. Further, FIG. 18 is a perspective view of portions illustrated in FIG. 17 as viewed from above on a side on which the electrical connectors 116 are arranged. In FIG. 18, in the protuberant portions 1654a and 1654b, portions having heights protruding from the front surface of the relay substrate 118 (hatched portions in FIG. 18) constitute the electromagnetic wave propagation suppressing units 1652a and 1652b.

In particular, in the present embodiment, recess portions 1656a and 1656b are respectively formed on surfaces of the electromagnetic wave propagation suppressing units 1652a and 1652b facing the side edges 318c and 318d. The recess portions 1656a and 1656b have a semicircular shape in a plan view in the present embodiment.

Thus, in the optical modulator 1600, as illustrated by the thick arrow in FIG. 17, propagation directions of the lateral leaked microwaves input on the recess portions 1656a and 1656b are reflected first in a direction opposite to a direction (upward direction in FIG. 17) in which the optical modulation element 102 is disposed. Therefore, in the optical modulator 1600, the influence of the lateral leaked microwave on the optical modulation element 102 can be further reduced, as compared with the optical modulators 100 and 1000.

Further, each time some of the lateral leaked microwaves are reflected inside the recess portions 1656a and 1656b, apart of the power is absorbed inside the electromagnetic wave propagation suppressing units 1652a and 1652b, so that the influence of the lateral leaked microwave on the optical modulation element 102 is further reduced.

In the present embodiment, the electromagnetic wave propagation suppressing units 1652a and 1652b are provided with one recess portion 1656a and one recess portion 1656b having a semicircular plan view, respectively, but the present embodiment is not limited to this. The number of recess portions respectively provided in the electromagnetic wave propagation suppressing units 1652a and 1652b may be plurality, and a shape of such a recess portion in a plan view can be any shape as long as the lateral leaked microwaves can be reflected first in a direction different from the direction (upward direction in FIG. 17) in which the optical modulation element 102 is disposed.

Modification Example of Third Embodiment

Figure 19:
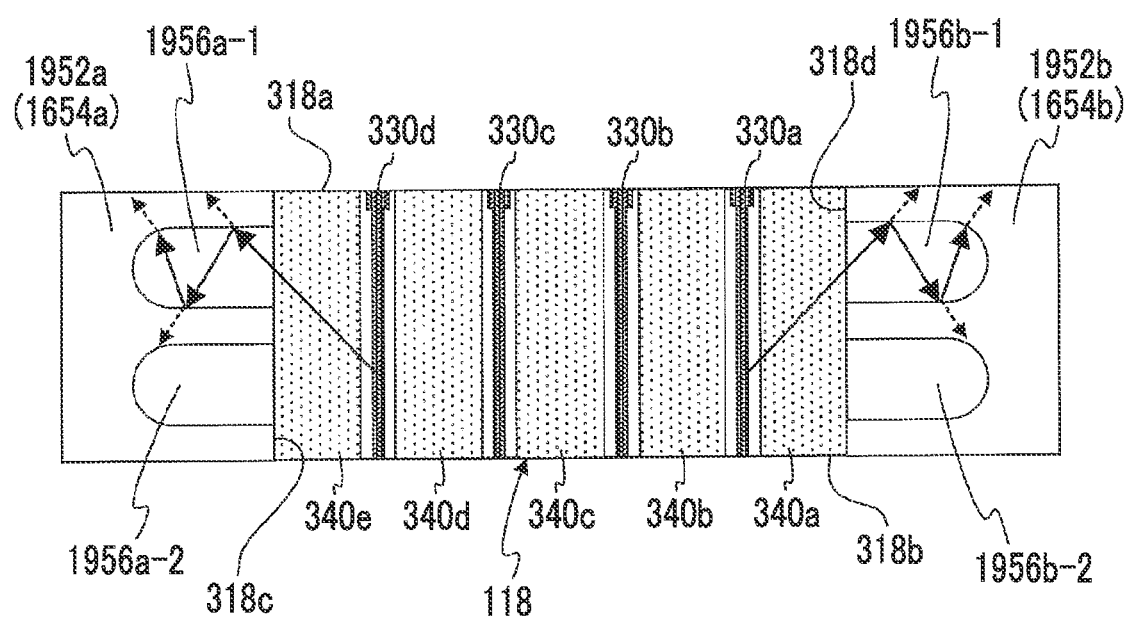
FIG. 19 is a plan view illustrating a configuration of an electromagnetic wave propagation suppressing unit according to a modification example of the third embodiment of the present invention.
Figure 20:
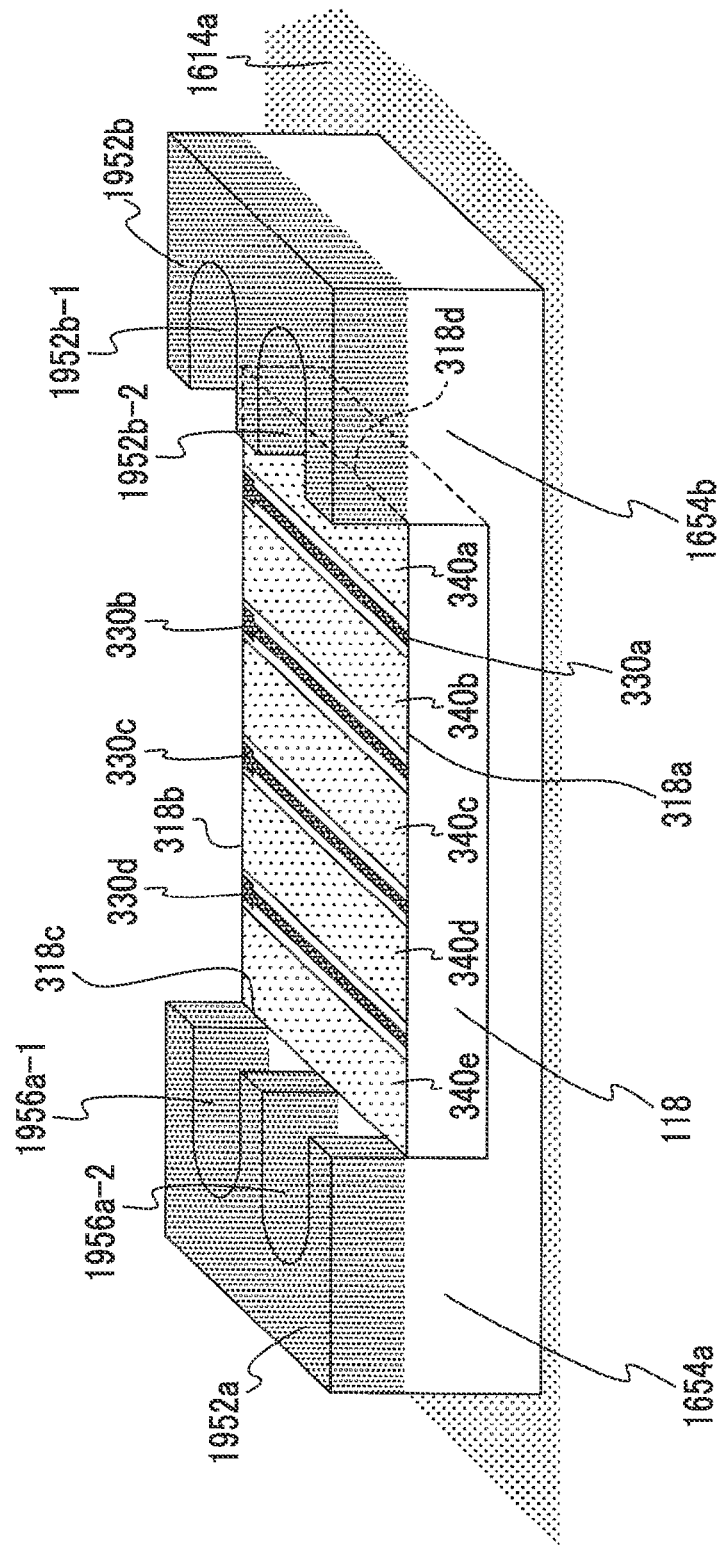
FIG. 20 is a perspective view illustrating the configuration of the electromagnetic wave propagation suppressing unit of the modification example according to the third embodiment of the present invention.

FIGS. 19 and 20 are diagrams illustrating a configuration of electromagnetic wave propagation suppressing units 1952a and 1952b according to a modification example of the third embodiment, and are views respectively corresponding to a partial detail view illustrated in FIG. 17 and a perspective view illustrated in FIG. 18 for the third embodiment described above. The electromagnetic wave propagation suppressing units 1952a and 1952b can be formed in the case 1614a of the housing 1604 instead of the electromagnetic wave propagation suppressing units 1652a and 1652b, in the optical modulator 1600 illustrated in FIG. 16. In FIGS. 19 and 20, the same reference numerals as those in FIGS. 17 and 18 are respectively used for the same components as those of the components illustrated in FIGS. 17 and 18, and the above descriptions of FIGS. 17 and 18 are adopted.

The electromagnetic wave propagation suppressing units 1952a and 1952b (hatched portions illustrated in FIG. 20) are configured as portions of the protuberant portions 1654a and 1654b provided on the case 1614a of the housing 1604 protruding from the front surface of the relay substrate 118, in the same manner as the electromagnetic wave propagation suppressing units 1652a and 1652b. However, unlike the electromagnetic wave propagation suppressing units 1652a and 1652b, in the electromagnetic wave propagation suppressing units 1952a and 1952b, two recess portions 1956a-1 and 1956a-2 and recess portions 1956b-1 and 1956b-2 are respectively provided on a surface facing the side edges 318c and 318d.

Further, unlike the recess portions 1656a and 1656b, each of the recess portions 1956a-1, 1956a-2, 1956b-1, and 1956b-2 has a rectangular portion and a semicircular portion in a plan view, and lengths extending from the side edges 318c and 318d toward an inside of the protuberant portions 1654a and 1654b are longer than a radius of the semicircular.

Thus, in the electromagnetic wave propagation suppressing units 1952a and 1952b according to the present modification example, in the same manner as the electromagnetic wave propagation suppressing units 1652a and 1652b, for example, as illustrated by the thick arrow in FIG. 19, propagation directions of the lateral leaked microwaves input toward the recess portion 1956a-1 and 1956b-1 are reflected first in a direction opposite to the direction (upward direction in FIG. 17) in which the optical modulation element 102 is disposed. Therefore, in the optical modulator 1660, the influence of the lateral leaked microwave on the optical modulation element 102 can be further reduced, as compared with the optical modulators 100 and 1000.

Then, the lateral leaked microwaves input on the recess portions 1956a-1 and 1956b-1 are then reflected inside the recess portions 1956a-1 and 1956b-1 more times than in the recess portions 1656a and 1656b, and each time the lateral leaked microwaves are reflected, apart of the power is absorbed inside the electromagnetic wave propagation suppressing units 1952a and 1952b. Therefore, in the electromagnetic wave propagation suppressing units 1952a and 1952b of the present modification example, the influence of the lateral leaked microwaves on the operation of the optical modulation element 102 can be further reduced, as compared with the electromagnetic wave propagation suppressing units 1652a and 1652b.

The preferable condition for the height h of the electromagnetic wave propagation suppressing units 152a and 152b described for the optical modulator 100 according to the first embodiment and the first modification example thereof, and the preferable condition for the separation distance d3 between the electromagnetic wave propagation suppressing units 552a and 552b and the relay substrate 118 can be commonly applied to the optical modulators 100, 1000, and 1600 according to the first, second, and third embodiments and the electromagnetic wave propagation suppression units according to the modification examples.

Fourth Embodiment

Next, a fourth embodiment of the present invention will be described. The present embodiment includes an optical transmission apparatus in which any of the optical modulators 100, 1000, and 1600 according to the first to third embodiments and the optical modulators according to their modification examples.

Figure 21:
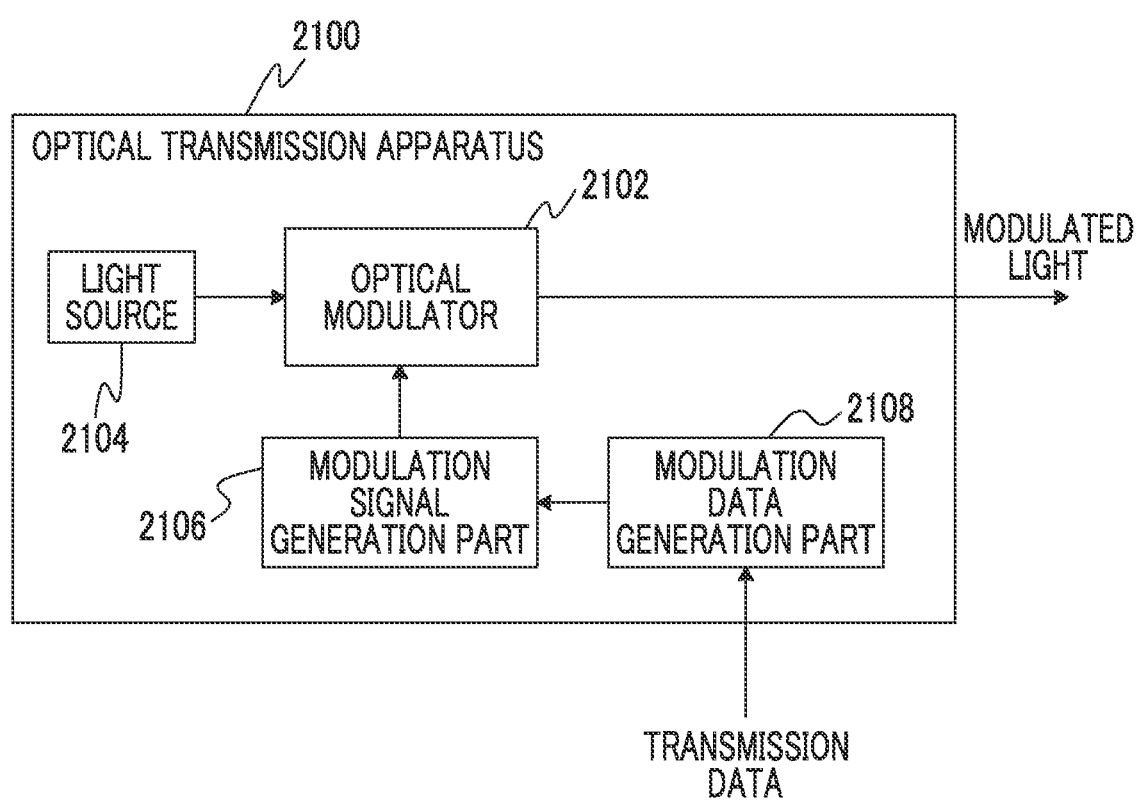
FIG. 21 is a diagram illustrating a configuration of an optical transmission apparatus according to a fourth embodiment of the present invention.
Figure 22:
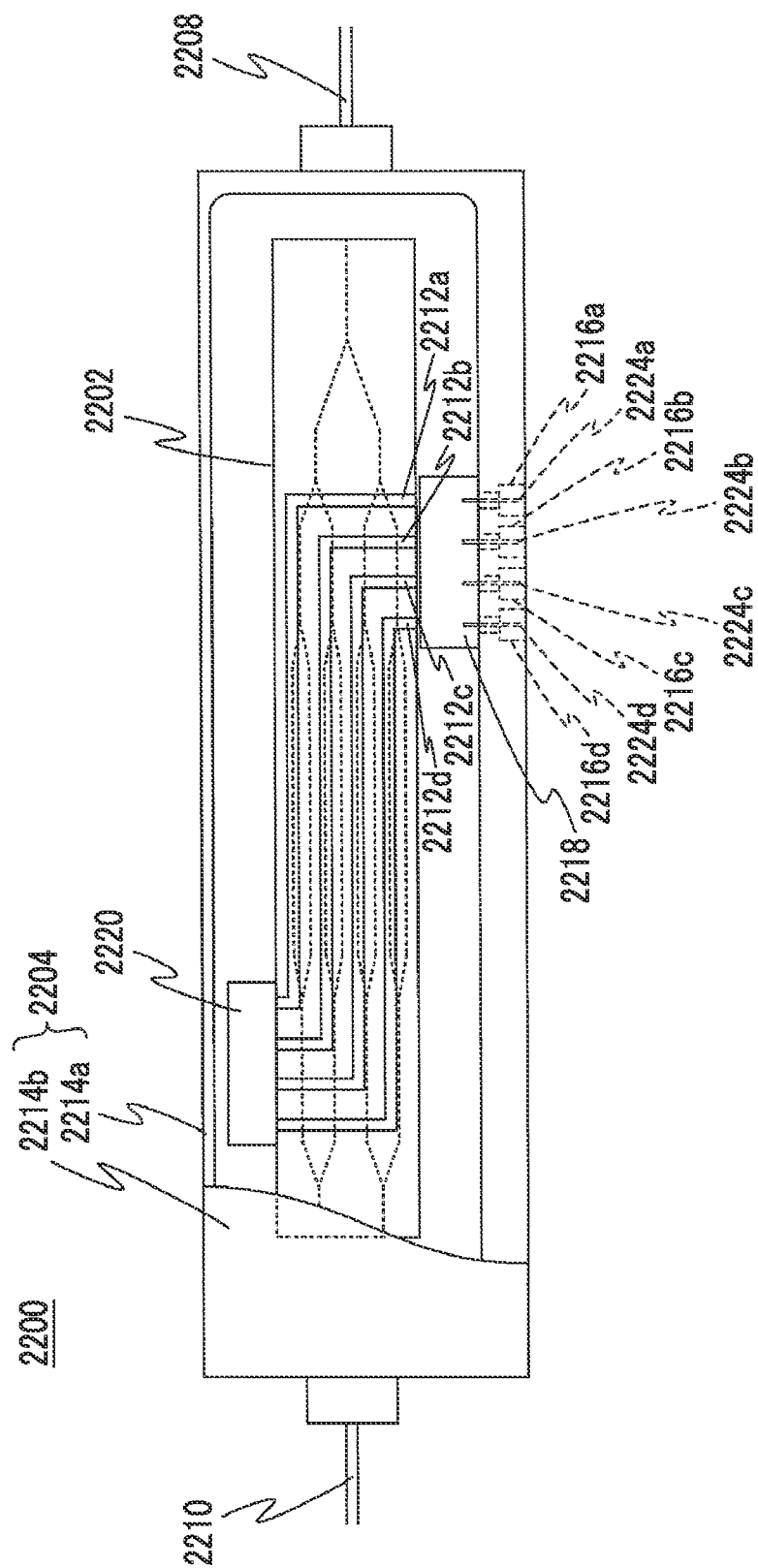
FIG. 22 illustrates an example of a configuration of an optical modulator in the related art.

FIG. 21 is a diagram illustrating a configuration of an optical transmission apparatus according to the present embodiment. An optical transmission apparatus 2100 includes an optical modulator 2102, a light source 2104 that inputs light to the optical modulator 2102, a modulation signal generation part 2106, and a modulation data generation part 2108.

The optical modulator 2102 may be any of the optical modulators 100, 1000, and 1600 according to the first to third embodiments described above and the optical modulators according to the modification examples thereof. Here, in order to avoid redundant description and facilitate understanding, the optical modulator 2102 is assumed to be the optical modulator 100 according to the first embodiment, hereinafter.

The modulation data generation part 2108 receives transmission data given from the outside, generates modulation data for transmitting the transmission data (for example, data obtained by converting or processing transmission data into a predetermined data format), and outputs the generated modulation data to the modulation signal generation part 2106.

The modulation signal generation part 2106 is an electronic circuit (drive circuit) that outputs an electrical signal for causing the optical modulator 2102 to perform a modulation operation, generates a modulation signal which is a high-frequency signal for making the optical modulator 2102 perform an optical modulation operation according to the modulation data, based on the modulation data which is output by the modulation data generation part 2108, and inputs the generated modulation signal to the optical modulator 2102. The modulation signal includes four high-frequency electrical signals corresponding to the four signal electrodes 112a, 112b, 112c, and 112d of the optical modulation element 102 provided in the optical modulator 2102.

The four high-frequency electrical signals are input from the signal input terminals 124a, 124b, 124c, and 124d of the respective electrical connectors 116a, 116b, 116c, and 116d of the optical modulator 2102 to the signal conductor patterns 330a, 330b, 330c, and 330d on the relay substrate 118, and are input to the signal electrodes 112a, 112b, 112c, and 112d of the optical modulation element 102 via the signal conductor pattern 330a or the like.

Thus, the light output from the light source 2104 is, for example, DP-QPSK modulated by the optical modulator 2102 and output as modulated light from the optical transmission apparatus 2100.

In particular, in the optical transmission apparatus 2100, as the optical modulator 2102, any of the optical modulators 100, 1000, and 1600 according to the first to third embodiments and the optical modulators according to their modification examples is used. Therefore, in the optical transmission apparatus 2100, due to the above-described lateral leaked microwaves generated with the high-frequency transmission rate or the like, it is possible to effectively reduce an increase in crosstalk between high-frequency electrical signals driving the optical modulation element 102, to secure stable and appropriate optical modulation characteristics, and to realize stable and appropriate transmission characteristics.

The present invention is not limited to the configurations of the embodiments and the modification examples described above, and can be realized in various aspects without departing from the spirit thereof.

For example, the electromagnetic wave propagation suppressing unit 152a or the like formed on the relay substrate 118 described in the second embodiment and its modification examples can be used together with the electromagnetic wave propagation suppressing unit 152a or the like including the substrate carrier 150 and the like described in the first embodiment and the third embodiment, and their modification examples, and/or the electromagnetic wave propagation suppressing unit 1652a or the like configured as a part of the protuberant portion 1654a or the like of the housing 1604.

Further, the material of the electromagnetic wave suppressing unit 152 or the like described in the first to third embodiments and their modification examples is not limited to metal and ferrite, and can be configured with any material having a characteristic of absorbing electromagnetic waves.

Further, the shape of the electromagnetic wave propagation suppressing unit 1652a or the like having the recess portion 1656a or the like described in the third embodiment and its modification example is not limited to the recess portion such as the recess portion 1656a, and may have a protruding portion capable of forming the same shape in the electromagnetic wave propagation suppressing unit 1652a or the like.

As described above, the optical modulators 100, 1000, and 1600 according to the above-described embodiment include the optical modulation element 102 having a plurality of signal electrodes 112, a plurality of signal input terminals 124 that respectively input electrical signals to be applied to the respective signal electrodes 112, the relay substrate 118 on which a plurality of signal conductor pattern 330 and a plurality of ground conductor pattern 340 that electrically connect the signal input terminal 124 and the signal electrode 112 are formed, and the housing 104 that accommodates the optical modulation element 102 and the relay substrate 118. Among the sides of the relay substrate 118, the signal input side 318a on which the signal input terminal 124 is connected to the signal conductor pattern 330 and the signal output side 318b on which the signal conductor pattern 330 is connected to the signal electrode 112 face each other in a plan view. Further, among the sides of the relay substrate 118, along at least one side connecting an end portion on the signal input side and an end portion on the signal output side in a plan view, for example, the side edge 318c and/or 318d, the electromagnetic wave propagation suppressing units 152a and 152b which are made of a material that absorbs electromagnetic waves and have a height protruding from the surface of the relay substrate 118.

With this configuration, it is possible to effectively suppress the lateral leaked microwaves generated by the interference of a plurality of leaked microwaves generated at the signal connection points between the relay substrate 118 and the signal input terminal 124 from propagating in the space above the surface of the relay substrate 118, and the influence on the operation of the optical modulation element 102 (for example, crosstalk between signal lines), and to realize appropriate optical modulation characteristics.

Further, in the optical modulator 100, the relay substrate 118 is mounted on the substrate carrier 150 which is configured separately from the housing 104. The electromagnetic wave propagation suppressing units 152a and 152b are provided on the substrate carrier 150. With this configuration, the propagation of lateral leaked microwaves can be effectively suppressed, and it is also possible to suppress the generation of thermal stress on the relay substrate 118 due to a difference in linear expansion coefficient between the relay substrate 118 and the housing 104.

Further, the electromagnetic wave propagation suppressing units 152a and 152b, and the like can be made of metal. Then, in an appropriate configuration of the first modification example of the optical modulator 100 according to the first embodiment described above, the electromagnetic wave propagation suppressing units 552a and 552b and the ground conductor patterns 340a and 340b of the relay substrate 118 are respectively connected by the conductor wires 554. Here, the conductor wire 554 can be a metal wire or a metal ribbon.

With this configuration, the effect of the propagation characteristics of the lateral leaked microwaves by the electromagnetic wave propagation suppressing units 552a and 552b can be further enhanced.

Further, in the optical modulator 1000 according to the second embodiment described above, the electromagnetic wave propagation suppressing units 1152a and 1152b and the like are provided on the relay substrate 118. With this configuration, as compared with the optical modulator 100, the electromagnetic wave propagation suppressing units 1152a and 1152b and the like are arranged closer to the connection point between the signal conductor pattern 330, which is a generation source of the leaked microwave, and the signal input terminal 124, so that the propagation of the lateral leaked microwaves can be suppressed more effectively.

Further, in the second modification example of the optical modulator 100 according to the first embodiment, lengths of the electromagnetic wave propagation suppressing units 752a and 752b along the side edges 318c and 318d, which are sides of the relay substrate on which the electromagnetic wave propagation suppressing units 752a and 752b are formed, are equal to or higher than ⅕ of lengths of the sides. With this configuration, in a case where it is difficult to form the electromagnetic wave propagation suppressing unit having a height protruding from the front surface of the relay substrate 118 along the entire side edges 318c and 318d due to design, manufacturing constraint conditions and the like, it is possible to suppress the propagation of lateral leaked microwaves by providing the electromagnetic wave propagation suppressing unit in a part of the side edges 318c and 318d in a length direction.

Further, in the optical modulator 1600 according to the third embodiment, the recess portions 1656a and 1656b are formed on the surfaces of the electromagnetic wave propagation suppressing units 1652a and 1652b. These recess portions 1656a and 1656b can be configured with protruding portions having shapes in the same manner.

With this configuration, the recess portions 1656a and 1656b can reflect first the lateral leaked microwaves input on the electromagnetic wave propagation suppressing units 1652a and 1652b in a direction opposite to the direction in which the optical modulation element 102 is disposed, so that the influence of the lateral leaked microwaves on the operation of the optical modulation element 102 can be further reduced.

Further, in the optical modulator 1000 according to the second embodiment, the electromagnetic wave propagation suppressing units 1352a and 1532b, and the like can be configured with a plurality of conductor wires 1354 erected by being connected to the ground conductor pattern 340 of the relay substrate 118. Here, the conductor wire can be, for example, a metal wire or a metal ribbon. According to this configuration, the electromagnetic wave propagation suppressing unit can be configured on the relay substrate 118 with a simple configuration.

Further, the heights h of the electromagnetic wave propagation suppressing unit 152a and 152b, and the like measured from the surface of the relay substrate 118 are larger than a separation distance of the signal conductor pattern 330 formed on the relay substrate 118 and the ground conductor pattern 340 adjacent to the signal conductor pattern 330.

With this configuration, it is possible to suppress the lateral leaked microwaves propagating in the space along the front surface of the relay substrate 118 from propagating in the main portions (power concentration portion of the microwave).

Further, the optical transmission apparatus 2100 according to the fourth embodiment described above includes any of the optical modulators 100 and the like and the modification examples thereof according to the first to third embodiments described above, and the modulation signal generation part 2106 or the like which is an electronic circuit that outputs an electrical signal for performing a modulation operation of any of the optical modulator 100 and the like and the modification examples. With this configuration, for example, the propagation of lateral leaked microwaves, which becomes noticeable as the transmission rate is increased, is suppressed and crosstalk and the like between a plurality of high-frequency electrical signals that drive the optical modulation element 102 is effectively reduced, so it is possible to realize stable and appropriate transmission characteristics.

REFERENCE SIGNS LIST 100, 1000, 1600, 2102, 2200 . . . optical modulator
102, 2202 . . . optical modulation element
104, 1604, 2204 . . . housing
108, 2208 . . . input optical fiber
110, 2210 . . . output optical fiber
112, 112a, 112b, 112c, 112d, 2212, 2212a, 2212b, 2212c, 2212d . . . signal electrode 114a, 1614a, 2214a . . . case
114b, 2214b . . . cover
116, 116a, 116b, 116c, 116d, 2216, 2216a, 2216b, 2216c, 2216d . . . electrical connector
118, 2218 . . . relay substrate
120, 2220 . . . terminator
122, 122a, 122b, 122c, 122d, 122e, 2222a, 2222b, 2222c, 2222d, 2222e . . . ground electrode
124, 124a, 124b, 124c, 124d, 2224, 2224a, 2224b, 2224c, 2224d . . . signal input terminal
126, 554, 1354 . . . conductor wire
318a . . . signal input side
318b . . . signal output side
318c, 318d . . . side edge
330, 330a, 330b, 330c, 330d, 2230, 2230a, 2230b, 2230c, 2230d . . . signal conductor pattern
340, 340a, 340b, 340c, 340d, 340e, 2240a, 2240b, 2240c, 2240d, 2240e . . . ground conductor pattern
150, 550, 750, 850, 950 . . . substrate carrier
152a, 152b, 522a, 552b, 752a, 752b, 852a, 852b, 952a, 952b, 1152a, 1152b, 1252a, 1252b, 1352a, 1352b, 1452a, 1452b, 1552a, 1552b, 1652a, 1652b, 1952a, 1952b . . . electromagnetic wave propagation suppressing unit
856a, 856b . . . support
956a, 956b . . . pin
956a-1, 956b-1 . . . protruding portion
1654a, 1654b . . . protuberant portion
1656a, 1656b, 1956a-1, 1956a-2, 1956b-1, 1956b-2 . . . recess portion
2100 . . . optical transmission apparatus
2104 . . . light source
2106 . . . modulation signal generation part
2108 . . . modulation data generation part
2290 . . . spherical wave
2292 . . . diffracted wave

The invention claimed is:

1. An optical modulator comprising:
an optical modulation element that includes a plurality of signal electrodes;
a plurality of signal input terminals each of which inputs an electrical signal to be applied to each of the plurality of signal electrodes;
a relay substrate having, on a surface of the relay substrate, a plurality of signal conductor patterns that electrically connect the plurality of signal input terminals to the plurality of signal electrodes, and a plurality of ground conductor patterns; and
a housing that accommodates the optical modulation element and the relay substrate,
wherein among sides of the relay substrate, a signal input side on which the plurality of signal input terminals is connected to the plurality of signal conductor patterns and a signal output side on which the plurality of signal conductor patterns is connected to the plurality of signal electrodes face each other in a plan view, and
an electromagnetic wave propagation suppressing unit made of a material that absorbs electromagnetic waves and protruding to a height higher than any of the plurality of signal conductor patterns and the plurality of ground conductor patterns of the relay substrate is provided along at least one side connecting an end portion of the signal input side and an end portion of the signal output side in the plan view, among the sides of the relay substrate.

2. The optical modulator according to claim 1,
wherein the relay substrate is mounted on a substrate carrier fixed to the housing so that the relay substrate is mounted on the housing via the substrate carrier, and
the electromagnetic wave propagation suppressing unit is provided on a surface of the substrate carrier on which the relay substrate is mounted.

3. The optical modulator according to claim 2,
wherein the electromagnetic wave propagation suppressing unit is made of metal, and
the electromagnetic wave propagation suppressing unit and the plurality of ground conductor patterns of the relay substrate are connected by a metal wire or a metal ribbon.

4. The optical modulator according to claim 1,
wherein the electromagnetic wave propagation suppressing unit is provided on the relay substrate.

5. The optical modulator according to claim 1,
wherein a length of the electromagnetic wave propagation suppressing unit along a side of the relay substrate on which the electromagnetic wave propagation suppressing unit is formed is equal to or higher than ⅕ of a length of the side.

6. The optical modulator according to claim 1,
wherein a recess portion or a protruding portion is formed on a surface of the electromagnetic wave propagation suppressing unit.

7. The optical modulator according to claim 1,
wherein the electromagnetic wave propagation suppressing unit includes a plurality of metal wires or metal ribbons connected to the plurality of ground conductor patterns of the relay substrate.

8. The optical modulator according to claim 1,
wherein the height of the electromagnetic wave propagation suppressing unit measured from the surface of the relay substrate is larger than a separation distance between each of the plurality of signal conductor patterns formed on the relay substrate and ground conductor patterns of the plurality of ground conductor patterns which are adjacent to each of the plurality of signal conductor patterns.

9. An optical transmission apparatus comprising:
the optical modulator according to claim 1; and
an electronic circuit that outputs an electrical signal for causing the optical modulator to perform a modulation operation.

* * * * *